United States Patent
Kim et al.

(10) Patent No.: US 12,448,677 B2
(45) Date of Patent: Oct. 21, 2025

(54) MASK ASSEMBLY AND METHOD FOR MANUFACTURING OF THE SAME

(71) Applicant: SAMSUNG DISPLAY CO., LTD., Yongin-si (KR)

(72) Inventors: Se Il Kim, Hwaseong-si (KR); Sang Min Yi, Suwon-si (KR); Eui Gyu Kim, Suwon-si (KR); Dae Won Baek, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/192,468

(22) Filed: Mar. 29, 2023

(65) Prior Publication Data

US 2023/0240124 A1   Jul. 27, 2023

Related U.S. Application Data

(62) Division of application No. 16/988,954, filed on Aug. 10, 2020, now abandoned.

(30) Foreign Application Priority Data

Feb. 7, 2020   (KR) .................. 10-2020-0014916

(51) Int. Cl.
C23C 14/04    (2006.01)
C23C 14/24    (2006.01)
H10K 71/00    (2023.01)
H10K 71/16    (2023.01)

(52) U.S. Cl.
CPC ............ *C23C 14/042* (2013.01); *C23C 14/24* (2013.01); *H10K 71/00* (2023.02); *H10K 71/164* (2023.02); *H10K 71/166* (2023.02)

(58) Field of Classification Search
CPC .................................................. C23C 14/042
See application file for complete search history.

(56) References Cited

U.S. PATENT DOCUMENTS

| | | |
|---|---|---|
| 8,881,676 B2 | 11/2014 | Hong |
| 9,192,959 B2 | 11/2015 | Hong |
| 9,346,078 B2 | 5/2016 | Oh et al. |

(Continued)

FOREIGN PATENT DOCUMENTS

| | | |
|---|---|---|
| CN | 102347456 A | 2/2012 |
| CN | 102760842 A | 10/2012 |

(Continued)

OTHER PUBLICATIONS

Chinese Office Action dated Aug. 21, 2024, issued in corresponding Chinese Patent Application No. 202110006236.6 (9 pages).

*Primary Examiner* — Keath T Chen
(74) *Attorney, Agent, or Firm* — Womble Bond Dickinson (US) LLP

(57) ABSTRACT

A mask assembly and method for manufacturing of the same are provided. A mask assembly includes: a mask frame including a first mask opening and a second mask opening which are located side by side in a first direction and defined by a support bar; a first split mask overlapping the first mask opening; and a second split mask overlapping the second mask opening, and the first split mask and the second split mask are spaced apart from each other in a region overlapping the support bar.

19 Claims, 20 Drawing Sheets

(56) References Cited

U.S. PATENT DOCUMENTS

| | | |
|---|---|---|
| 2002/0102754 A1 | 8/2002 | Fujimori et al. |
| 2003/0221614 A1 | 12/2003 | Kang et al. |
| 2004/0021410 A1 | 2/2004 | Stagnitto et al. |
| 2004/0142108 A1 | 7/2004 | Atobe et al. |
| 2007/0134567 A1* | 6/2007 | Park ............... C23C 14/042 |
| | | 430/394 |
| 2011/0139069 A1 | 6/2011 | Ahn et al. |
| 2012/0266813 A1 | 10/2012 | Hong |
| 2014/0150721 A1 | 6/2014 | Oh et al. |
| 2016/0301006 A1 | 10/2016 | Obata et al. |
| 2016/0310988 A1 | 10/2016 | Lee et al. |
| 2016/0343945 A1* | 11/2016 | Kim ................ C23C 14/042 |
| 2017/0125680 A1 | 5/2017 | Lee et al. |
| 2017/0250208 A1* | 8/2017 | Kim ................. H01L 27/127 |
| 2017/0268093 A1 | 9/2017 | Ji et al. |
| 2018/0239241 A1* | 8/2018 | Lv ......................... G03F 7/12 |
| 2018/0287064 A1* | 10/2018 | Matsueda .......... C23C 14/24 |
| 2019/0259951 A1* | 8/2019 | Seong ................ C23C 14/12 |
| 2019/0352765 A1* | 11/2019 | Ono .................... C23C 14/34 |
| 2020/0384497 A1 | 12/2020 | Lv et al. |

FOREIGN PATENT DOCUMENTS

| | | | | |
|---|---|---|---|---|
| CN | 103855325 A | | 6/2014 | |
| CN | 104372291 | * | 2/2015 | ........... C23C 14/042 |
| CN | 108091775 | * | 5/2018 | ........... C23C 14/042 |
| JP | 4609187 B2 | | 10/2010 | |
| JP | 2018-127705 A | | 8/2018 | |
| KR | 2007-0120266 A | | 12/2007 | |
| KR | 101029999 | * | 4/2011 | ........... C23C 14/042 |
| KR | 10-1182239 B1 | | 9/2012 | |
| KR | 10-2019-0058055 | | 5/2019 | |
| KR | 10-2019-0062918 A | | 6/2019 | |

\* cited by examiner

MASK ASSEMBLY AND METHOD FOR MANUFACTURING OF THE SAME

CROSS-REFERENCE TO RELATED APPLICATIONS

This application is a divisional of U.S. application Ser. No. 16/988,954, filed on Aug. 10, 2020, which claims priority to and the benefit of Korean Patent Application No. 10-2020-0014916, filed on Feb. 7, 2020 in the Korean Intellectual Property Office, the entire disclosures of both of which are incorporated herein by reference.

BACKGROUND

1. Field

Aspects of embodiments of the present disclosure relate to a mask assembly and a method for manufacturing of the same.

2. Description of the Related Art

As a flat panel display, a liquid crystal display (LCD) and an organic light emitting display (OLED) are widely used. The flat panel display includes a metal layer having a specific pattern, and, in the case of the organic light emitting display, an organic light emitting layer having a specific pattern is formed for each pixel. As a method of forming the metal layer and the organic light emitting layer, a deposition method using a mask assembly may be adopted.

The mask assembly includes a mask having an opening corresponding to a pattern of a metal layer or an organic light emitting layer, and a mask frame supporting the mask. In a split mask method, the mask is divided into a plurality of split masks having a stick, or bar, shape, and each split mask is fixed by welding to the mask frame in a state in which it is tensioned in a longitudinal direction thereof. The split mask method has an advantage that products of high quality can be produced and used and, also, the split mask is easy to repair.

Meanwhile, as a substrate for manufacturing an organic light emitting display becomes larger, the size of the mask assembly also increases. However, the size of the equipment for manufacturing the mask assembly may have limitations of size.

SUMMARY

According to aspects of the present disclosure, a mask assembly capable of use with a large-area substrate and preventing or substantially preventing bending or deflection of a mask, and a method of manufacturing the same, are provided.

However, aspects of the present disclosure are not restricted to those set forth herein. The above and other aspects of the present disclosure will become more apparent to one of ordinary skill in the art to which the present disclosure pertains by referencing the description of the present disclosure provided below.

According to a mask assembly according to embodiments and a method of manufacturing the same, it is possible to deposit a deposition material on a large-area substrate by including a first split mask and a second split mask. Further, it is possible to prevent or substantially prevent deformation of the split mask due to a volume difference for each region of the split mask by including a half-etched portion. Further, it is possible to prevent or substantially prevent bending of the split mask from extending to a central portion thereof due to a volume difference for each region of the split mask by including a dummy pattern portion.

However, aspects and effects of the present disclosure are not limited to the aforementioned aspects and effects, and various other aspects and effects are included in the present specification.

According to one or more embodiments of the present disclosure, a mask assembly includes: a mask frame including a first mask opening and a second mask opening which are located side by side in a first direction and defined by a support bar; a first split mask overlapping the first mask opening; and a second split mask overlapping the second mask opening, and the first split mask and the second split mask are spaced apart from each other in a region overlapping the support bar.

In an embodiment, the mask frame includes: a first side extending in a second direction intersecting the first direction; and a second side in parallel with the first side and spaced apart from the first side, and the support bar is between the first side and the second side.

In an embodiment, a first end of the first split mask overlaps the first side and a second end of the first split mask overlaps the support bar, and a first end of the second split mask overlaps the support bar and a second end of the second split mask overlaps the second side.

In an embodiment, the first split mask includes: first fixing portions overlapping the first side and the support bar, respectively; first deposition pattern portions between the first fixing portions and including a plurality of first pattern openings; and first rib portions between the first deposition pattern portions.

In an embodiment, the second split mask includes: second fixing portions overlapping the second side and the support bar, respectively; second deposition pattern portions between the second fixing portions and including a plurality of second pattern openings; and second rib portions between the second deposition pattern portions.

In an embodiment, the first fixing portion overlapping the support bar and the second fixing portion overlapping the support bar are adjacent to each other and spaced apart from each other in a region overlapping the support bar.

In an embodiment, the first split mask includes a first welding portion on the first fixing portion overlapping the first side, and a second welding portion on the first fixing portion overlapping the support bar, and the second split mask includes a third welding portion on the second fixing portion overlapping the support bar, and a fourth welding portion on the second fixing portion overlapping the second side.

In an embodiment, the first split mask further comprises a first half-etched portion at least at one of the first and second ends of the first split mask, and the second split mask further comprises a second half-etched portion at least at one of the first and second ends of the second split mask.

In an embodiment, the first half-etched portion of the first split mask overlaps the support bar and the first fixing portion of the first split mask, and the second half-etched portion of the second split mask overlaps the support bar and the second fixing portion of the second split mask.

In an embodiment, the first half-etched portion of the first split mask overlaps the second welding portion, and the second half-etched portion of the second split mask overlaps the third welding portion.

In an embodiment, the first half-etched portion of the first split mask overlaps the first side and the first fixing portion of the first split mask, and the second half-etched portion of the second split mask overlaps the second side and the second fixing portion of the second split mask.

In an embodiment, the first half-etched portion of the first split mask overlaps the first welding portion, and the second half-etched portion of the second split mask overlaps the fourth welding portion.

In an embodiment, a thickness of the first half-etched portion is 30% to 70% of a thickness of the first split mask, and a thickness of the second half-etched portion is 30% to 70% of a thickness of the second split mask.

In an embodiment, the first half-etched portion is continuous or spaced apart from a side of the first split mask facing the second split mask, and the second half-etched portion is continuous or spaced apart from a side of the second split mask facing the first split mask.

In an embodiment, the first split mask further comprises a first dummy pattern portion at least at one of the first and second ends of the first split mask, and the second split mask further comprises a second dummy pattern portion at least at one of the first and second ends of the second split mask.

In an embodiment, the first dummy pattern portion of the first split mask is between the second welding portion and the first fixing portion, and the second dummy pattern portion of the second split mask is between the third welding portion and the second fixing portion.

In an embodiment, the first dummy pattern portion of the first split mask does not overlap the second welding portion of the first split mask and overlaps the support bar, and the second dummy pattern portion of the second split mask does not overlap the third welding portion of the second split mask and overlaps the support bar.

In an embodiment, the first dummy pattern portion of the first split mask is between the first welding portion and the first fixing portion, and the second dummy pattern portion of the second split mask is between the fourth welding portion and the second fixing portion.

In an embodiment, the first dummy pattern portion of the first split mask does not overlap the first welding portion of the first split mask and overlaps the first side, and the second dummy pattern portion of the second split mask does not overlap the fourth welding portion of the second split mask and overlaps the second side.

In an embodiment, the first dummy pattern portion and the second dummy pattern portion include at least one first dummy pattern portion and at least one second dummy pattern portion, respectively.

According to one or more embodiments of the present disclosure, a method of manufacturing a mask assembly includes: preparing a mask frame including a first mask opening and a second mask opening which are located side by side in a first direction and defined by a support bar; aligning a split mask so as to overlap the first mask opening and the second mask opening and coupling the split mask to the mask frame; and cutting a region of the split mask corresponding to the support bar to divide the split mask into a first split mask and a second split mask.

In an embodiment, the mask frame includes: a first side extending in a second direction intersecting the first direction; and a second side in parallel with the first side and spaced apart from the first side, and the support bar is between the first side and the second side.

In an embodiment, the coupling the split mask to the mask frame comprises: performing first welding on a first end of the split mask overlapping the first side; performing second welding on a first region of the split mask overlapping the support bar; performing third welding on a second region of the split mask overlapping the support bar; and performing fourth welding on a second end of the split mask overlapping the second side.

In an embodiment, the dividing the split mask into the first split mask and the second split mask comprises cutting between a second welding portion formed by the second welding and a third welding portion formed by the third welding in the split mask.

According to one or more embodiments of the present disclosure, a method of manufacturing a mask assembly includes: preparing a mask frame including a first mask opening and a second mask opening which are located side by side in a first direction and defined by a support bar; aligning a first split mask so as to overlap the first mask opening and the second mask opening and coupling two regions of the first split mask adjacent to the first mask opening to the mask frame; cutting a region of the first split mask corresponding to the support bar; aligning a second split mask so as to overlap the first split mask and the second mask opening and coupling two regions of the second split mask adjacent to the second mask opening to the mask frame; and cutting a region of the second split mask corresponding to the support bar.

In an embodiment, the mask frame includes a first side extending in a second direction intersecting the first direction; and a second side in parallel with the first side and spaced apart from the first side, and the support bar is between the first side and the second side.

In an embodiment, the coupling the first split mask to the mask frame comprises: performing first welding on an end of the first split mask overlapping the first side; and performing second welding on a region of the first split mask overlapping the support bar.

In an embodiment, the cutting the first split mask comprises cutting between the second mask opening and a second welding portion of the first split mask formed by the second welding.

In an embodiment, the coupling the second split mask to the mask frame comprises: performing third welding on a region of the second split mask overlapping the support bar; and performing fourth welding on an end of the second split mask overlapping the second side.

In an embodiment, the cutting the second split mask comprises cutting between the first mask opening and a third welding portion of the second split mask formed by the third welding.

BRIEF DESCRIPTION OF THE DRAWINGS

The above and other aspects and features of the present disclosure will become more apparent by describing in further detail some example embodiments thereof with reference to the attached drawings, in which.

DETAILED DESCRIPTION

Figure 1:
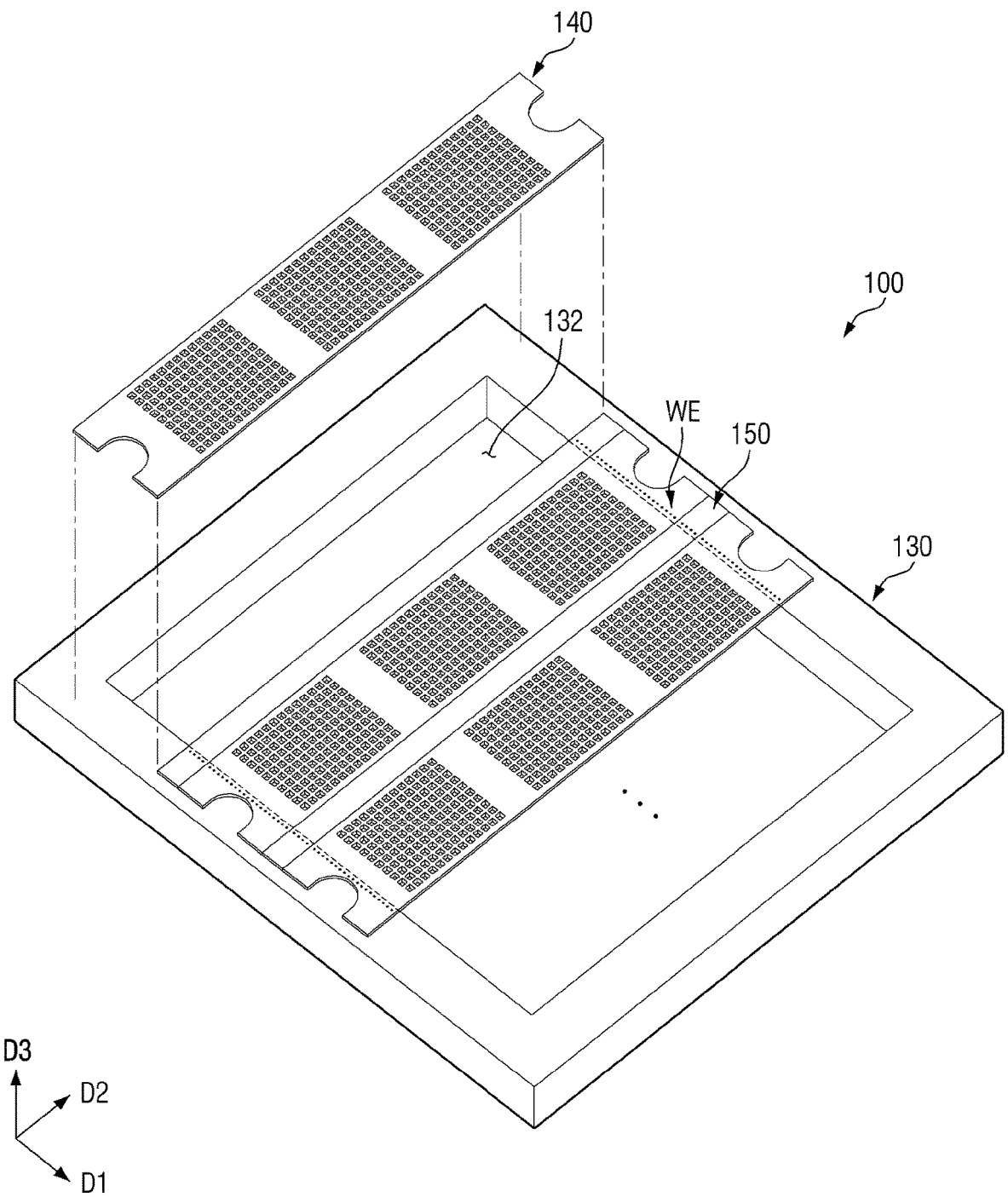
FIG. 1 is a perspective view of a mask assembly according to an embodiment of the present disclosure.

The present invention will now be described more fully herein with reference to the accompanying drawings, in which some example embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It is also to be understood that when a layer is referred to as being "on" another layer or substrate, it may be directly on the other layer or substrate, or one or more intervening layers may also be present. The same reference numbers indicate the same or like components throughout the specification. The shapes, sizes, ratios, angles, numbers, etc. disclosed in the drawings for describing the embodiments may be examples, and the present invention is not limited to those illustrated. As used herein, the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. For example, the device may be otherwise oriented (e.g., rotated 90 degrees or at other orientations) and the spatially relative descriptors used herein interpreted accordingly.

It is to be understood that, although the terms "first," "second," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a "first" element, component, region, layer, or section discussed below could be termed a "second" element, component, region, layer, or section without departing from the teachings of the inventive concept.

The meaning of "include" or "comprise" may specify a property, a fixed number, a step, an operation, an element, a component, or a combination thereof, but does not exclude other properties, fixed numbers, steps, operations, elements, components, or combinations thereof.

Unless otherwise defined, all terms (including technical and scientific terms) used herein have the same meaning as commonly understood by one of ordinary skill in the art to which example embodiments of the inventive concepts belong. It is to be further understood that terms, such as those defined in commonly-used dictionaries, should be interpreted as having a meaning that is consistent with their meaning in the context of the relevant art and are not to be interpreted in an idealized or overly formal sense unless expressly so defined herein.

Herein, some example embodiments of the present disclosure will be described in further detail with reference to the accompanying drawings.

Figure 2:
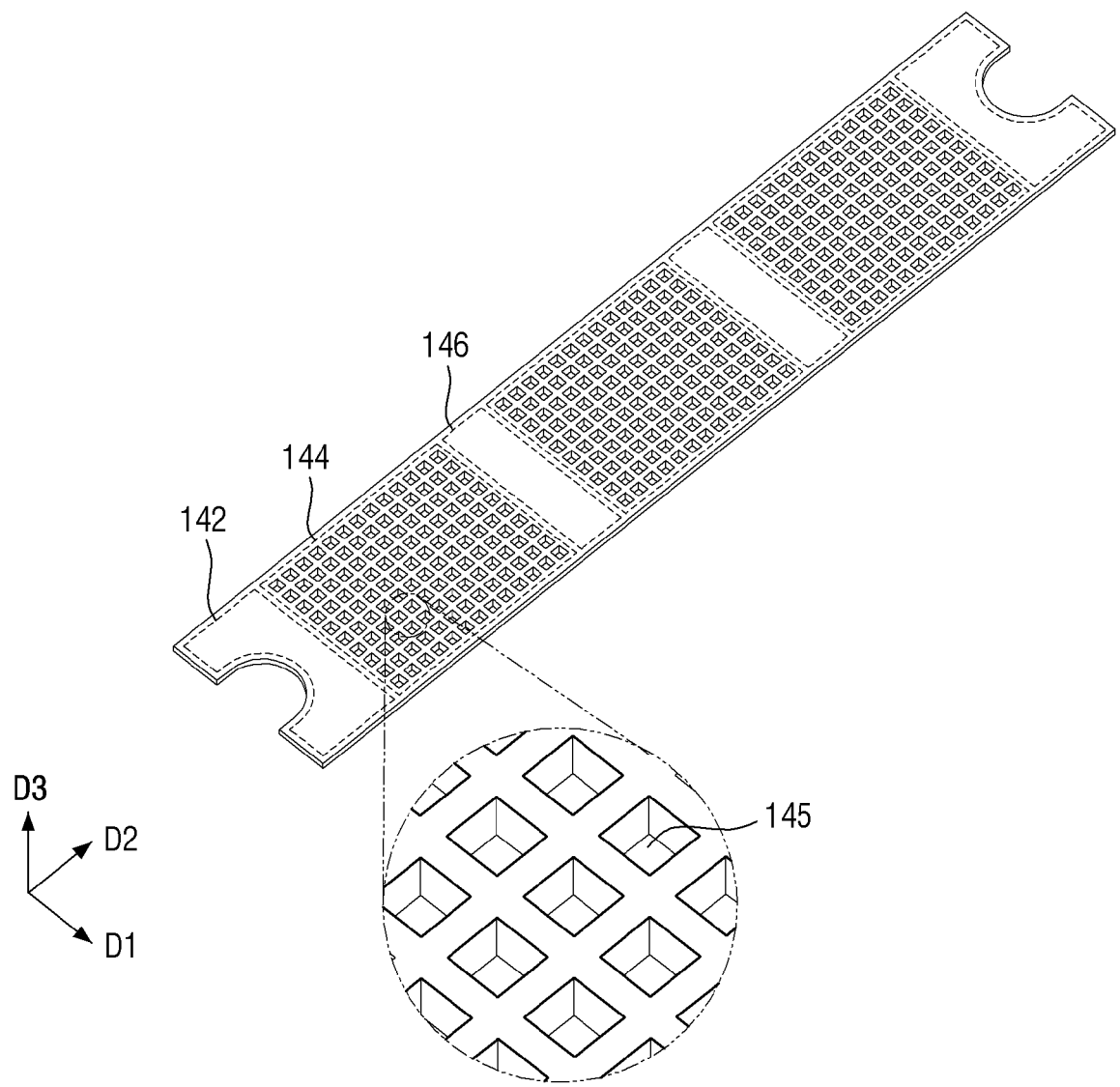
FIG. 2 is a perspective view of a split mask of FIG. 1.

FIG. 1 is a perspective view of a mask assembly according to an embodiment of the present disclosure; and FIG. 2 is a perspective view of a split mask of FIG. 1.

Referring to FIGS. 1 and 2, a mask assembly 100 according to an embodiment may include a mask frame 130 and a plurality of split masks 140 disposed on the mask frame 130.

The mask frame 130 forms an outer frame of the mask assembly 100 and may have a rectangular band shape in which a frame opening 132 is formed at a central portion thereof. The mask frame 130 may have a thickness (e.g., a predetermined thickness) in a third direction D3 to stably support the split masks 140 or the like. The mask frame 130 may include a pair of long sides and a pair of short sides, and the frame opening 132 may be disposed at the center thereof. For example, the pair of long sides may extend in a first direction D1 and be disposed parallel to each other in a second direction D2, and the pair of short sides may extend in the second direction D2 and be disposed parallel to each other in the first direction D1.

In an embodiment, the planar shape of the mask opening 132 may be approximately rectangular. The mask opening 132 may provide a path through which a deposition material passes. In another embodiment, the mask frame 130 may have a rectangular band shape in which both pairs of sides have the same length, and the planar shape of the mask opening 132 may be square. The mask frame 130 may include a material having high rigidity, for example, a metal, such as stainless steel.

The split mask 140 may be disposed on the mask frame 130. The split mask 140 may have a first surface (upper surface in the drawing) and a second surface (lower surface in the drawing). The first surface may be a surface in contact with a substrate (not shown) during a deposition process, and the second surface may be a surface opposite to the first surface and a surface toward which a deposition material is provided. The second surface of the split mask 140 may be in contact with the mask frame 130.

The split mask 140 may have a shape in which its length (e.g., length in the second direction D2) is greater than its width (e.g., width in the first direction D1). In an embodiment, the split mask 140 may be divided into a plurality of parts extending in the first direction D1 and adjacent in the second direction D2. In another embodiment, the split mask 140 may be a mother mask integrally formed with a planar area covering the frame opening 132. In an embodiment, the split mask 140 may be a fine metal mask made of a metal material. The split mask 140 may be made of metal, such as stainless steel, nickel, cobalt, or an alloy thereof. In some embodiments, the split mask 140 may have magnetic properties.

The split mask 140 may include fixing portions 142 located at both ends in its length direction (i.e., the second direction D2), a plurality of deposition pattern portions 144 located closer to a center portion than the fixing portions 142, and rib portions 146 located between the deposition pattern portions 144.

The fixing portion 142 is a portion which is in contact with and coupled to the mask frame 130. For example, the fixing portion 142 may be welded and coupled to the mask frame 130. The method of welding is not particularly limited, and may include, for example, laser welding, resistance heating welding, and the like. The fixing portion 142 may include a welding portion WE formed by being welded to the mask frame 130. The welding portion WE may be formed as a plurality of spots in a region corresponding to the fixing portion 142. In FIG. 1, the welding portion WE is illustrated as being arranged in one row, but the present disclosure is not limited thereto. The welding portion WE may be arranged in a plurality of rows, such as two or more rows.

The deposition pattern portion 144 is a portion in which a plurality of pattern openings 145 are formed to provide a path through which the deposition material passes. The plurality of deposition pattern portions 144 may be disposed in the length direction (i.e., the second direction D2) of the split mask 140. FIG. 1 illustrates a case in which three deposition pattern portions 144 are spaced apart in the second direction D2, but the present disclosure is not limited thereto. Further, the rib portion 146 may be disposed between the deposition pattern portions 144 adjacent to each other in the second direction D2. The rib portion 146 may be a reference for distinguishing the deposition pattern portions 144 adjacent to each other in the second direction D2. The rib portion 146 may block the deposition material from passing therethrough because no pattern opening is formed.

The deposition pattern portion 144 may correspond to one display device (for example, an organic light emitting display device). In this case, patterns corresponding to a plurality of display devices may be concurrently (e.g., simultaneously) deposited in a single process using one mask assembly 100. That is, the mask assembly 100 may correspond to one mother substrate and concurrently (e.g., simultaneously) form patterns corresponding to a plurality of display devices on the mother substrate.

The pattern opening 145 is an opening passing through the first surface and the second surface of the split mask 140. The pattern openings 145 of the split masks 140 arranged on the substrate may expose a deposition target region of the substrate. That is, the pattern opening 145 may have substantially the same planar shape as a deposition pattern to be formed. FIGS. 1 and 2 illustrate that the pattern openings 145 are spaced apart in the first direction D1 and the second direction D2 and arranged in a substantially matrix shape with a dot shape in a plan view, but the present disclosure is not limited thereto. For example, the pattern opening 145 may have a slit shape extending in the first direction D1 or the second direction D2 in a plan view.

The split mask 140 may be fixed to the mask frame 130 by welding in a state in which a tensile force is applied to both ends of the split mask 140 along the first direction D1 or the second direction D2. In another embodiment, the split mask 140 may be stretched in both the first direction D1 and the second direction D2.

In an embodiment, gap masks 150 may be disposed between the plurality of split masks 140. The gap masks 150 may be disposed at intervals between the split masks 140 to block the deposition material from passing between the split masks 140. The gap mask 150 may have a same length (length in the second direction D2) as the split mask 140. The gap mask 150 may not be provided with an opening to block the passage of the deposition material. In FIG. 1, a case in which the gap masks 150 are provided has been illustrated, but the present disclosure is not limited thereto, and, in an embodiment, the gap masks 150 may be omitted.

Meanwhile, as the substrate becomes larger, the size of the mask assembly is increased. However, since there is a limit in the size of the equipment for manufacturing the split masks to be coupled to the mask assembly, such as exposure equipment and photo masks, it is difficult to cope with the large-area substrate.

Herein, a mask assembly capable of use with a large-area substrate and a manufacturing method thereof will be described.

Figure 3:
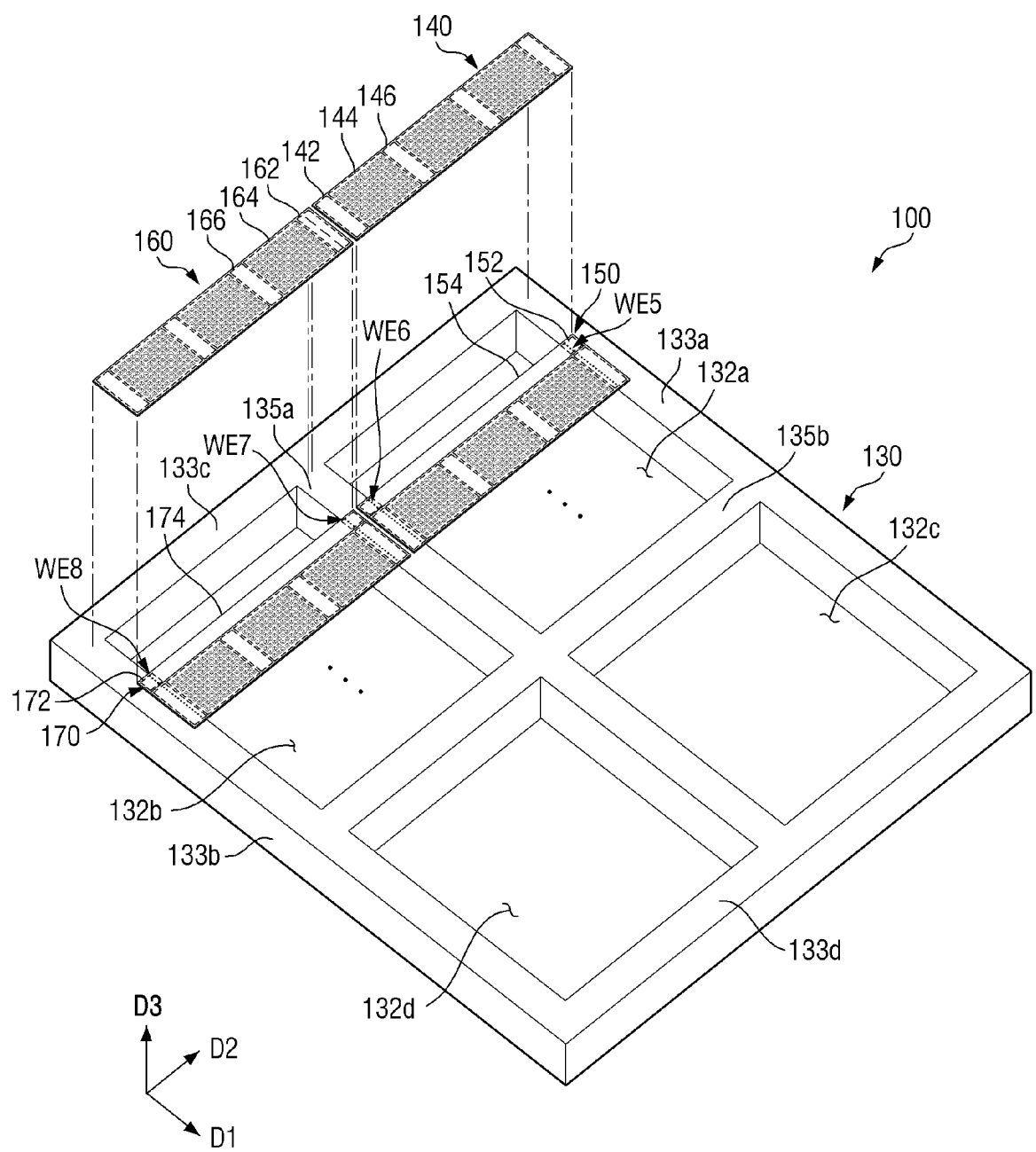
FIG. 3 is a perspective view schematically showing a mask assembly according to an embodiment.
Figure 4:
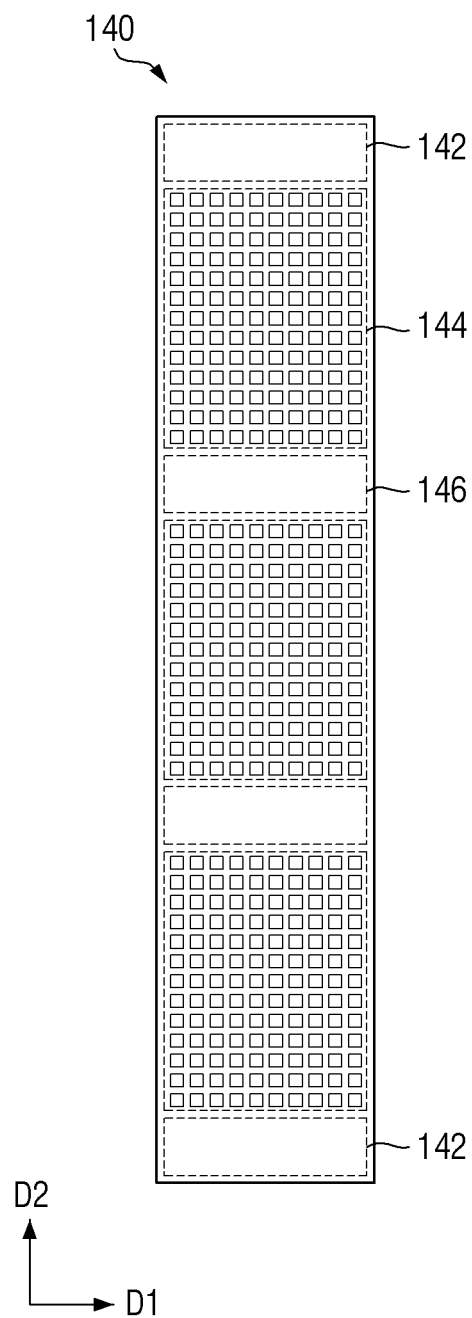
FIG. 4 is a plan view schematically illustrating a split mask according to an embodiment.
Figure 5:
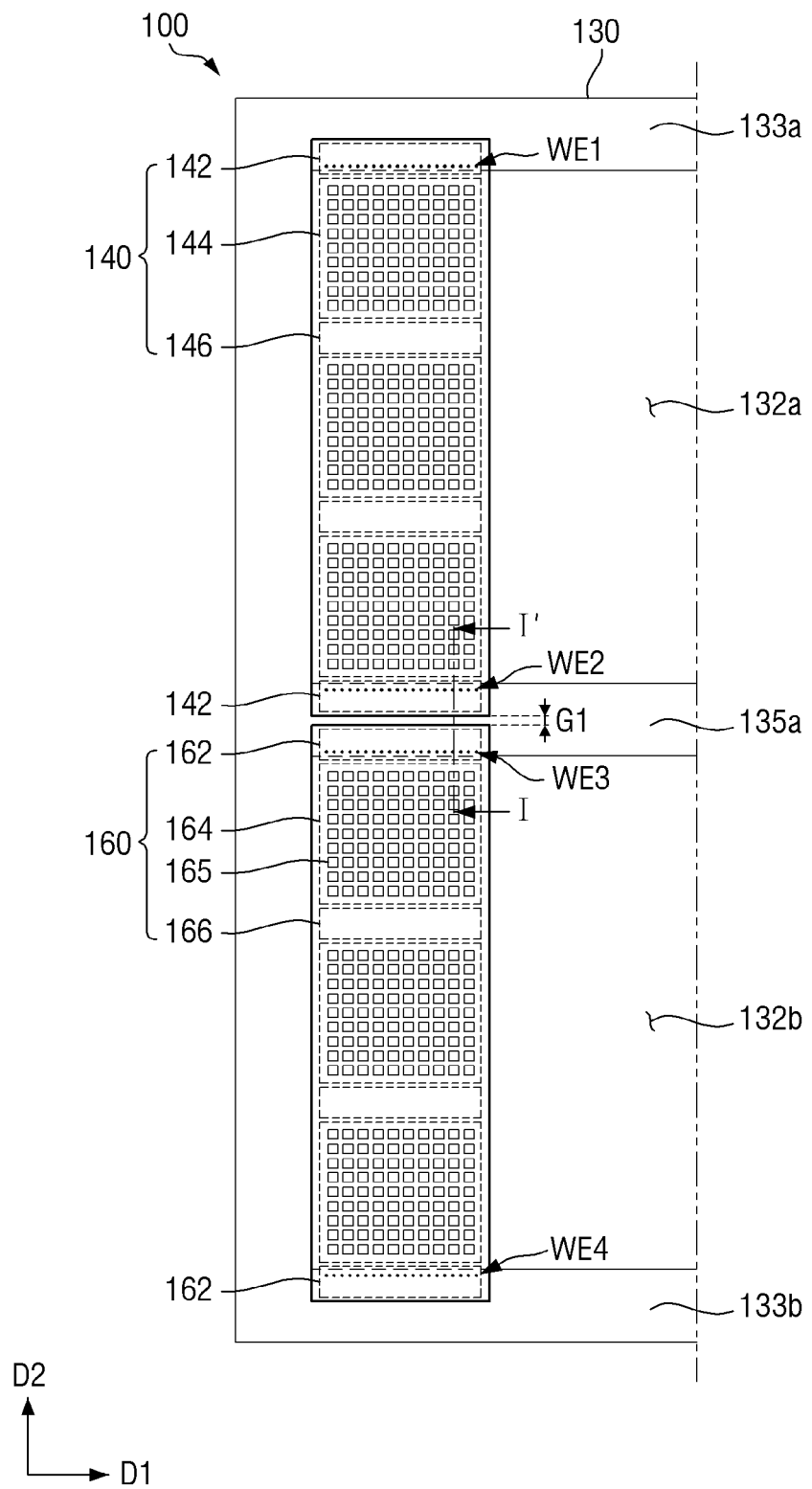
FIG. 5 is a plan view schematically illustrating a mask assembly according to an embodiment.
Figure 6:
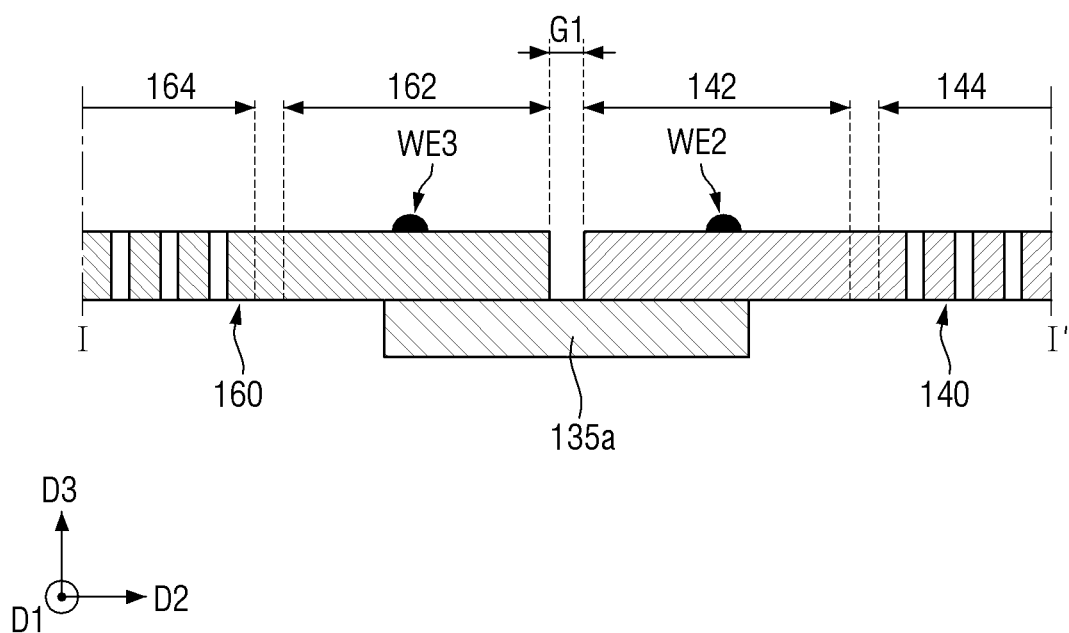
FIG. 6 is a cross-sectional view schematically showing a structure taken along the line I-I' of FIG. 5.

FIG. 3 is a perspective view schematically showing a mask assembly according to an embodiment; FIG. 4 is a plan view schematically illustrating a split mask according to an embodiment; FIG. 5 is a plan view schematically illustrating a mask assembly according to an embodiment; and FIG. 6 is a cross-sectional view schematically showing a structure taken along the line I-I' of FIG. 5.

Referring to FIGS. 3 to 6, a mask assembly 100 according to an embodiment may include a mask frame 130 and a plurality of split masks 140 disposed on the mask frame 130.

The mask frame 130 may include a pair of long sides and a pair of short sides and include a plurality of frame openings 132 at a central portion thereof. The pair of long sides may include a first side 133a extending in the first direction D1, and a second side 133b spaced apart from and parallel to the first side 133a. The pair of short sides may include a third side 133c connecting the first side 133a to the second side 133b in the second direction D2, and a fourth side 133d disposed to be parallel to the third side 133c and spaced apart from the third side 133c. In the present embodiment, the long sides and the short sides have been described, but the present disclosure is not limited thereto. That is, the sides may have the same length or the positions of the long side and the short side may be changed.

The mask frame 130 may include a first support part 135a and a second support part 135b passing through the central portion thereof. The first support part 135a may be disposed in parallel with the first side 133a and the second side 133b, and may connect the third side 133c to the fourth side 133d. The first support part 135a may extend in the first direction D1 perpendicular to the third side 133c and the fourth side 133d. The second support part 135b may perpendicularly intersect the first support part 135a. The second support part 135b may be disposed in parallel with the third side 133c and the fourth side 133*d* and may extend in the second direction D2 perpendicularly intersecting the first side 133*a* and the second side 133*b*.

The mask frame 130 may include therein first to fourth mask openings 132*a*, 132*b*, 132*c*, and 132*d* through which the deposition material passes. The first mask opening 132*a* may be an opening defined by the first side 133*a*, the third side 133*c*, the first support part 135*a*, and the second support part 135*b*. The second mask opening 132*b* may be an opening defined by the second side 133*b*, the third side 133*c*, the first support part 135*a*, and the second support part 135*b*. The third mask opening 132*c* may be an opening defined by the first side 133*a*, the fourth side 133*d*, the first support part 135*a*, and the second support part 135*b*. The fourth mask opening 132*d* may be an opening defined by the second side 133*b*, the fourth side 133*d*, the first support part 135*a*, and the second support part 135*b*. In the present embodiment, a case in which four openings are formed in the mask frame 130 through two support parts has been illustrated, but the present disclosure is not limited thereto, and six or more openings may be formed through three or more support parts.

The planar shape of the first mask opening 132*a*, the second mask opening 132*b*, the third mask opening 132*c* and the fourth mask opening 132*d* may be substantially rectangular. Each of the first mask opening 132*a*, the second mask opening 132*b*, the third mask opening 132*c* and the fourth mask opening 132*d* may correspond to the size of one mother substrate described with reference to FIG. 1. For example, the size of one mask assembly described with reference to FIG. 1 may correspond to the size of each of the first mask opening 132*a*, the second mask opening 132*b*, the third mask opening 132*c*, and the fourth mask opening 132*d*.

First split masks 140 and second split masks 160 may be disposed on the mask frame 130, respectively. The first split mask 140 may include first fixing portions 142 located at both ends in its length direction (i.e., the second direction D2), a plurality of first deposition pattern portions 144 located closer to the center of the first split mask 140 than the first fixing portions 142, and first rib portions 146 located between the first deposition pattern portions 144. The second split mask 160 may include second fixing portions 162 located at both ends in its length direction (i.e., the second direction D2), a plurality of second deposition pattern portions 164 located closer to the center of the second split mask 160 than the second fixing portions 162, and second rib portions 166 located between the second deposition pattern portions 164.

The first deposition pattern portion 144 of the first split mask 140 may include a plurality of first pattern openings 145, and the second deposition pattern portion 164 of the second split mask 160 may include a plurality of second pattern openings 165. In an embodiment, the first pattern openings 145 and the second pattern openings 165 have the same pattern shape, and a resultant product of the same deposition material may be deposited. In another embodiment, the first pattern openings 145 and the second pattern openings 165 have different pattern shapes, and different resultant products of deposition materials may be deposited. Accordingly, when the same deposition material is deposited concurrently (e.g., simultaneously) using one mask assembly 100, deposition materials having different shapes may be deposited on the substrate.

As shown in FIG. 5, the first split mask 140 may be disposed to overlap the first mask opening 132*a*. A first end of the first split mask 140 may overlap the first side 133*a* of the mask frame 130, and a second end of the first split mask 140 may overlap the first support part 135*a* of the mask frame 130. A first fixing portion 142 may be disposed at the first end of the first split mask 140, and the first fixing portion 142 and the first side 133*a* of the mask frame 130 may overlap each other. A first welding portion WE1 may be disposed on the first fixing portion 142 overlapping the first side 133*a* of the mask frame 130 to be coupled to the first side 133*a* of the mask frame 130. A first fixing portion 142 may be disposed at the second end of the first split mask 140, and the first fixing portion 142 and the first support part 135*a* may overlap each other. A second welding portion WE2 may be disposed on the first fixing portion 142 overlapping the first support part 135*a* to be coupled to the first support part 135*a*.

The second split mask 160 may be disposed to overlap the second mask opening 132*b*. A first end of the second split mask 160 may overlap the first support part 135*a* of the mask frame 130, and a second end of the second split mask 160 may overlap the second side 133*b* of the mask frame 130. A second fixing portion 162 may be disposed at the first end of the second split mask 160, and the second fixing portion 162 and the first support part 135*a* of the mask frame 130 may overlap each other. A third welding portion WE3 may be disposed on the second fixing portion 162 overlapping the first support part 135*a* of the mask frame 130 to be coupled to the first support part 135*a* of the mask frame 130. A second fixing portion 162 may be disposed at the second end of the second split mask 160, and the second fixing portion 162 and the second side 133*b* of the mask frame 130 may overlap each other. A fourth welding portion WE4 may be disposed on the second fixing portion 162 overlapping the second side 133*b* to be coupled to the second side 133*b* of the mask frame 130.

As shown in FIGS. 5 and 6, the first split mask 140 and the second split mask 160 may be spaced apart from each other. That is, the first split mask 140 and the second split mask 160 may be spaced apart from each other in a region overlapping the first support part 135*a* of the mask frame 130. A side of the first split mask 140 and a side of the second split mask 160 adjacent to the side of the first split mask 140 may be spaced apart from each other by a gap (e.g., a predetermined gap) G1. In an embodiment, the gap G1 between the first split mask 140 and the second split mask 160 may be 0.1 mm or more, and the first split mask 140 and the second split mask 160 may be sufficiently spaced apart from each other such as not to interfere with each other. The gap G1 between the first split mask 140 and the second split mask 160 separated from each other may be smaller than a width of the first support part 135*a* of the mask frame 130.

In an embodiment, since the first split mask 140 and the second split mask 160 are spaced apart from each other, even if deformation occurs in one split mask, the deformation can be prevented or substantially prevented from being transferred to another adjacent split mask. Thus, the pattern accuracy of the deposition material deposited on the substrate through the mask frame 130 can be prevented or substantially prevented from being lowered.

As illustrated in FIG. 3, a first gap mask 150 may be disposed between the first split masks 140, and a second gap mask 170 may be disposed between the second split masks 160. In the first gap mask 150, a third fixing portion 152 overlapping the first side 133*a* of the mask frame 130 may be disposed at a first end of the first gap mask 150, a third fixing portion 152 overlapping the first support part 135*a* of the mask frame 130 may be disposed at a second end of the first gap mask 150, and a first blocking portion 154 may be disposed between the third fixing portions 152. A fifth welding portion WE5 may be disposed at the third fixing portion 152 at the first end of the first gap mask 150 to be coupled to the first side 133a of the mask frame 130, and a sixth welding portion WE6 may be disposed at the third fixing portion 152 at the second end of the first gap mask 150 to be coupled to the first support part 135a of the mask frame 130.

In the second gap mask 170, similarly, a fourth fixing portion 172 overlapping the first support part 135a of the mask frame 130 may be disposed at a first end of the second gap mask 170, a fourth fixing portion 172 overlapping the second side 133b of the mask frame 130 may be disposed at a second end of the second gap mask 170, and a second blocking portion 174 may be disposed between the fourth fixing portions 172. A seventh welding portion WE7 may be disposed at the fourth fixing portion 172 at the first end of the second gap mask 170 to be coupled to the first support part 135a of the mask frame 130, and an eighth welding portion WE8 may be disposed at the fourth fixing portion 172 at the second end of the second gap mask 170 to be coupled to the second side 133b of the mask frame 130.

The first gap mask 150 and the second gap mask 170 may be spaced apart from each other. That is, the first gap mask 150 and the second gap mask 170 may be spaced apart from each other in a region overlapping the first support part 135a of the mask frame 130. A side of the first gap mask 150 and a side of the second gap mask 170 adjacent to the side of the first gap mask 150 may be spaced apart from each other by the gap G1. In an embodiment, the gap G1 between the first gap mask 150 and the second gap mask 170 may be 0.1 mm or more, and the first gap mask 150 and the second gap mask 170 may be sufficiently spaced apart from each other such as not to interfere with each other. The gap G1 between the first gap mask 150 and the second gap mask 170 separated from each other may be smaller than the width of the first support part 135a of the mask frame 130.

Herein, a method of manufacturing the mask assembly of FIG. 3 described above will be described.

Figure 7:
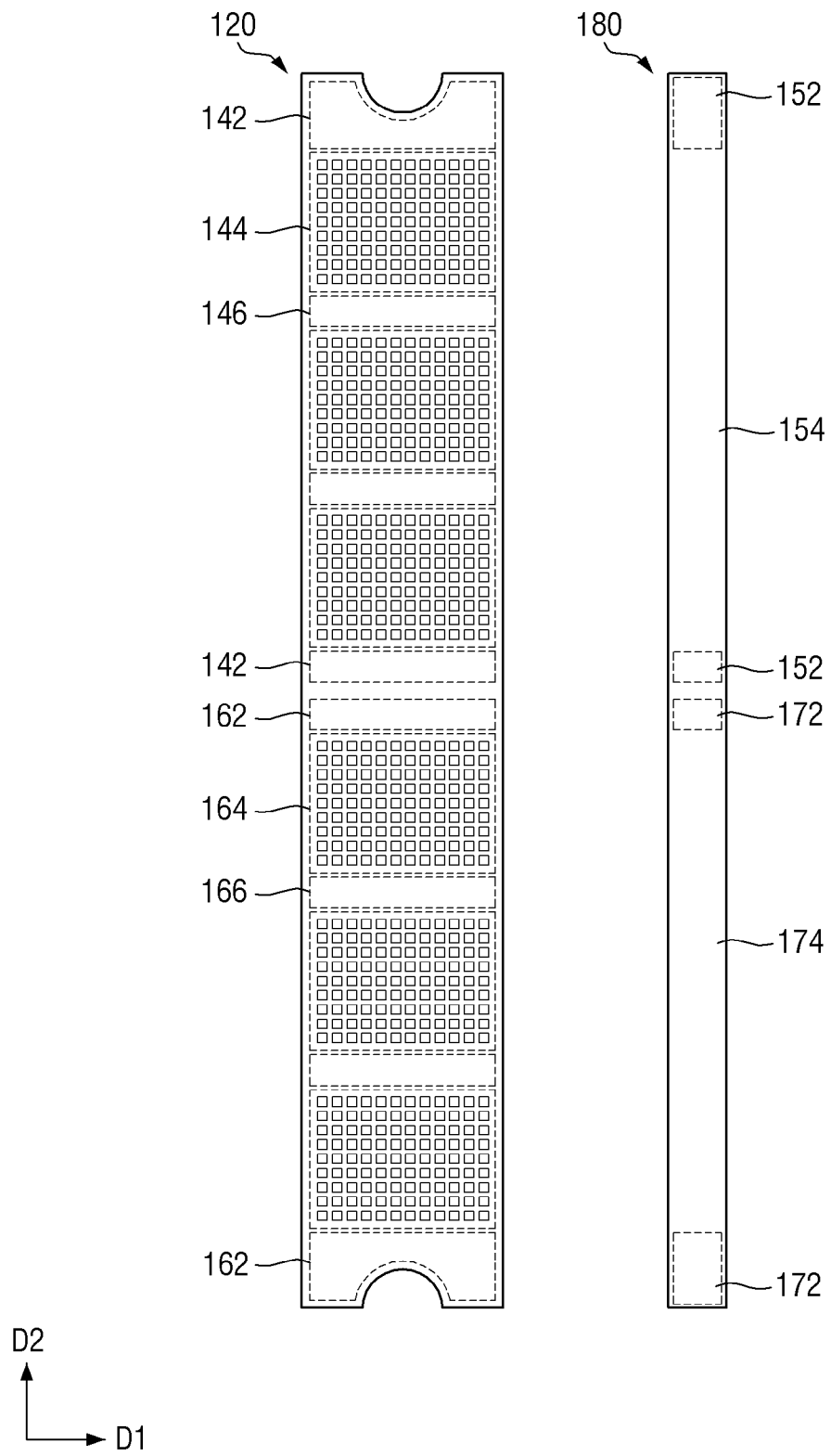
FIGS. 7 to 9 are views illustrating steps of a method of manufacturing a mask assembly according to an embodiment.
Figure 8:
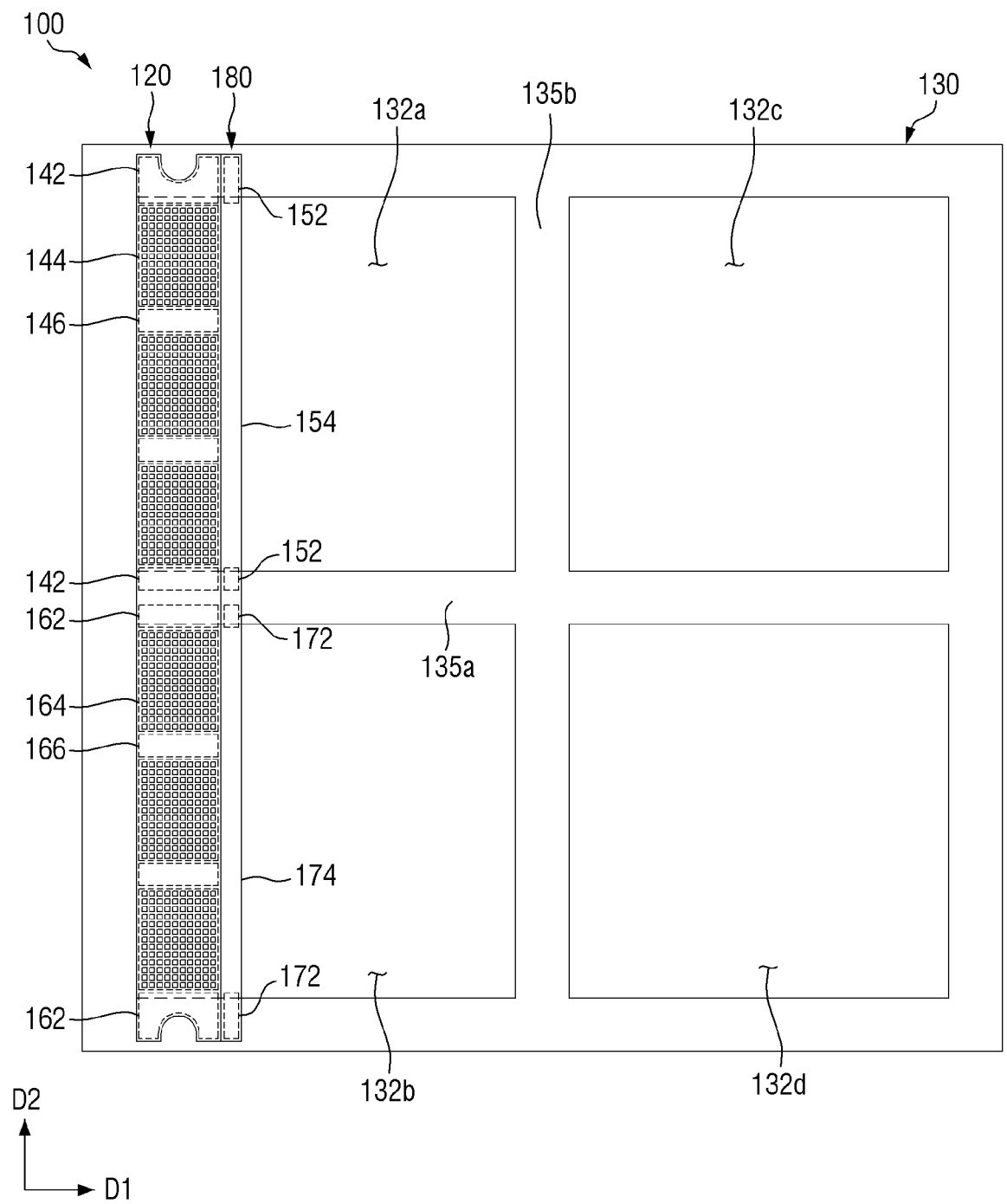
Figure 9:
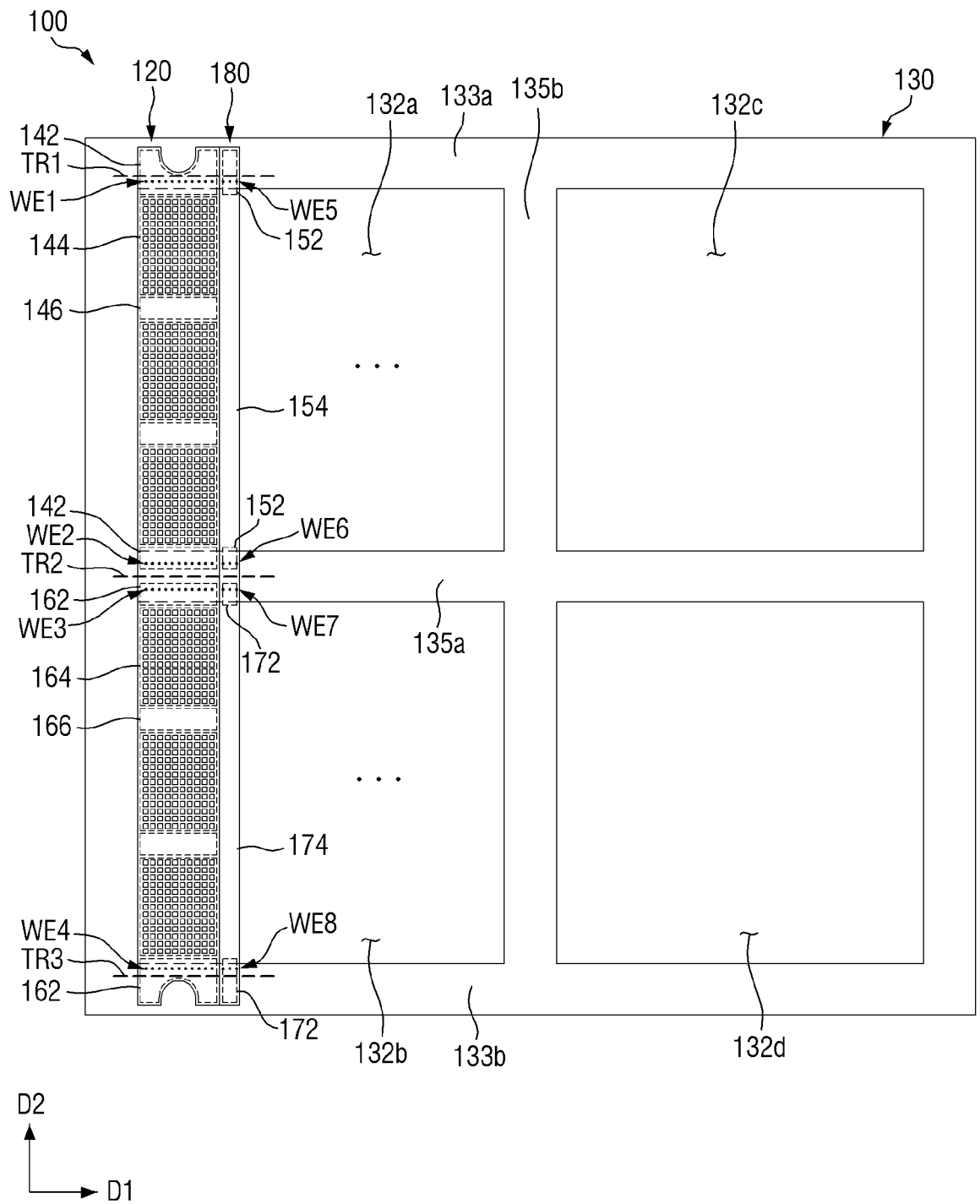
Figure 10:
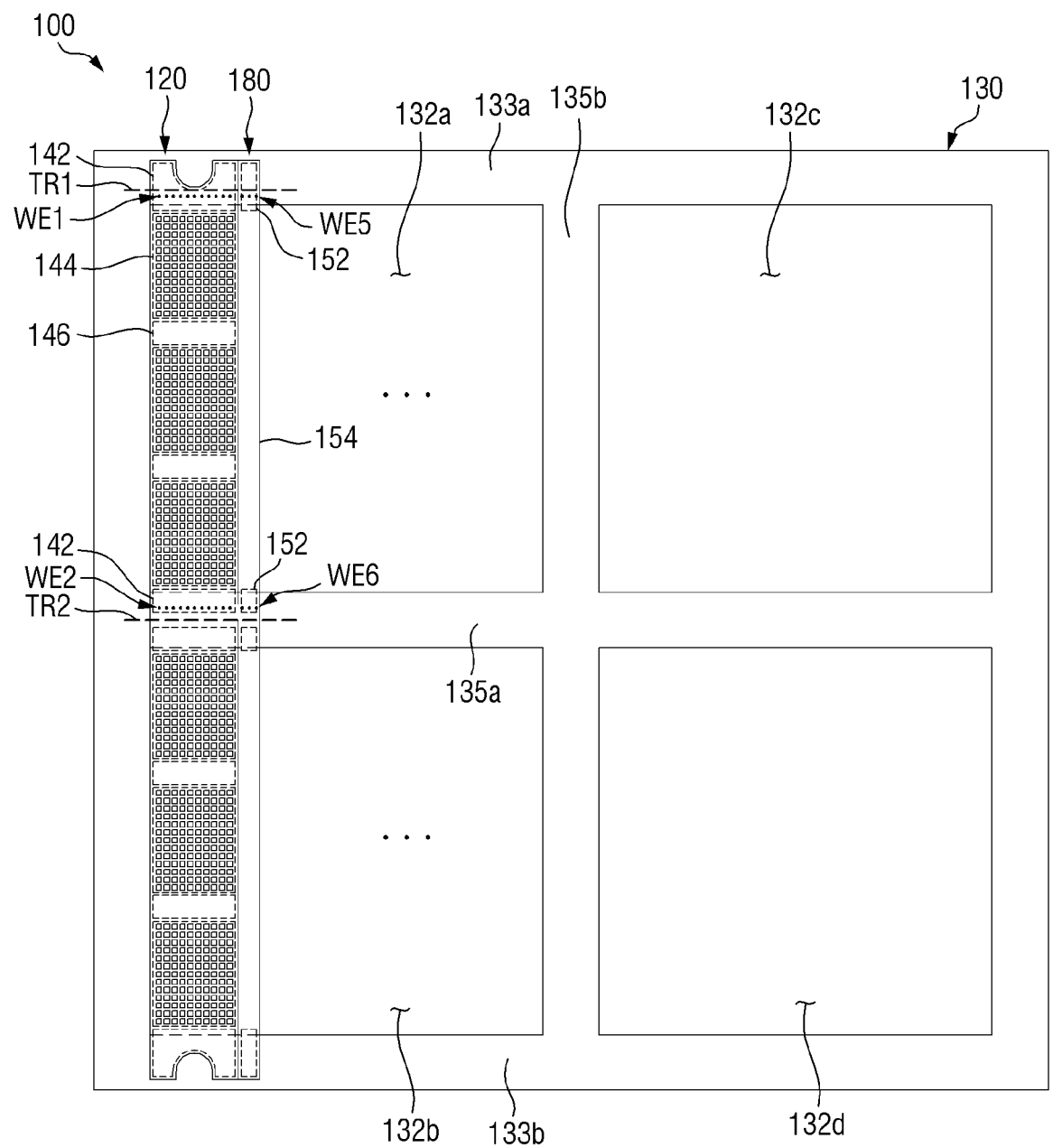
FIGS. 10 to 12 are views illustrating steps of a method of manufacturing a mask assembly according to another embodiment.
Figure 11:
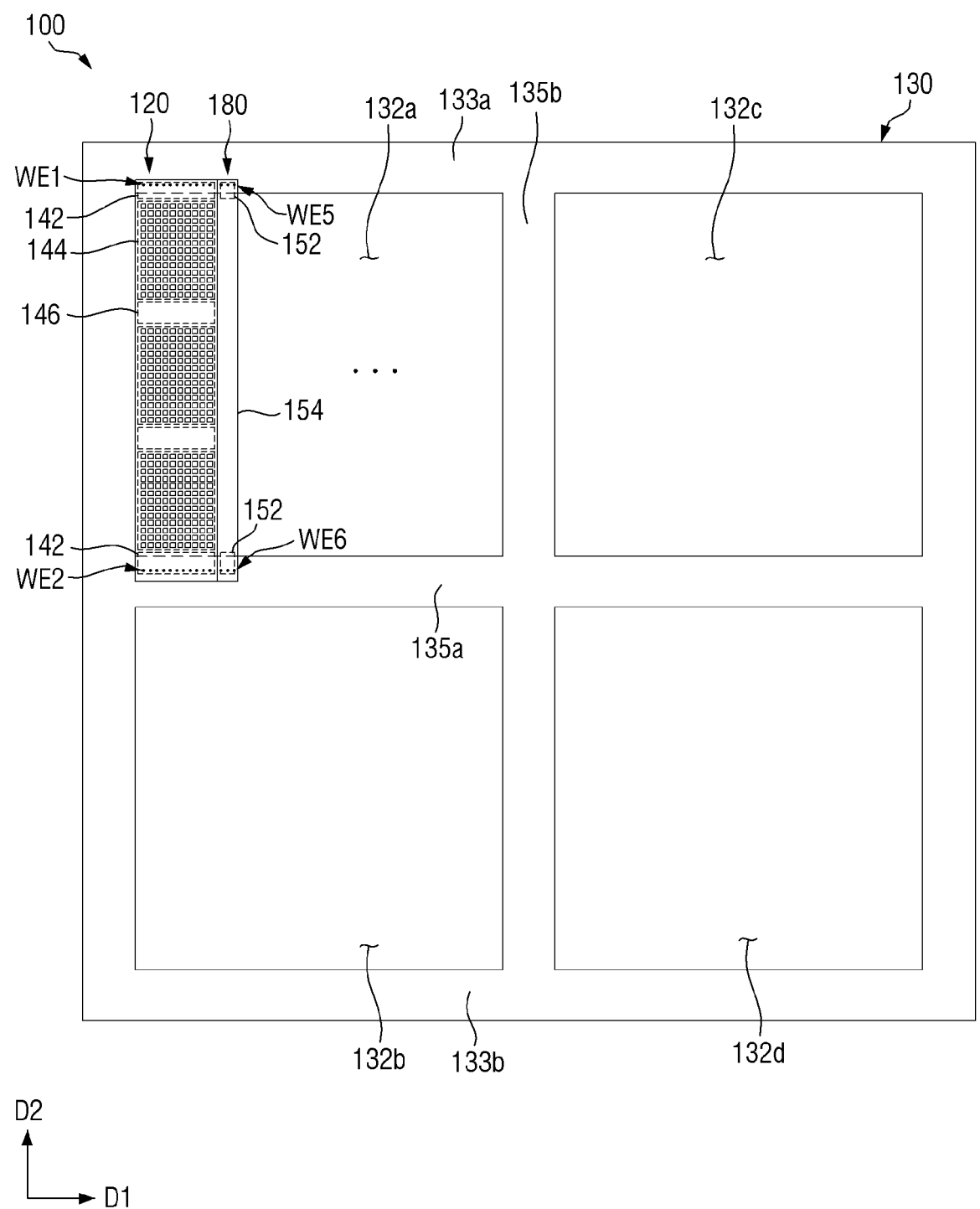
Figure 12:
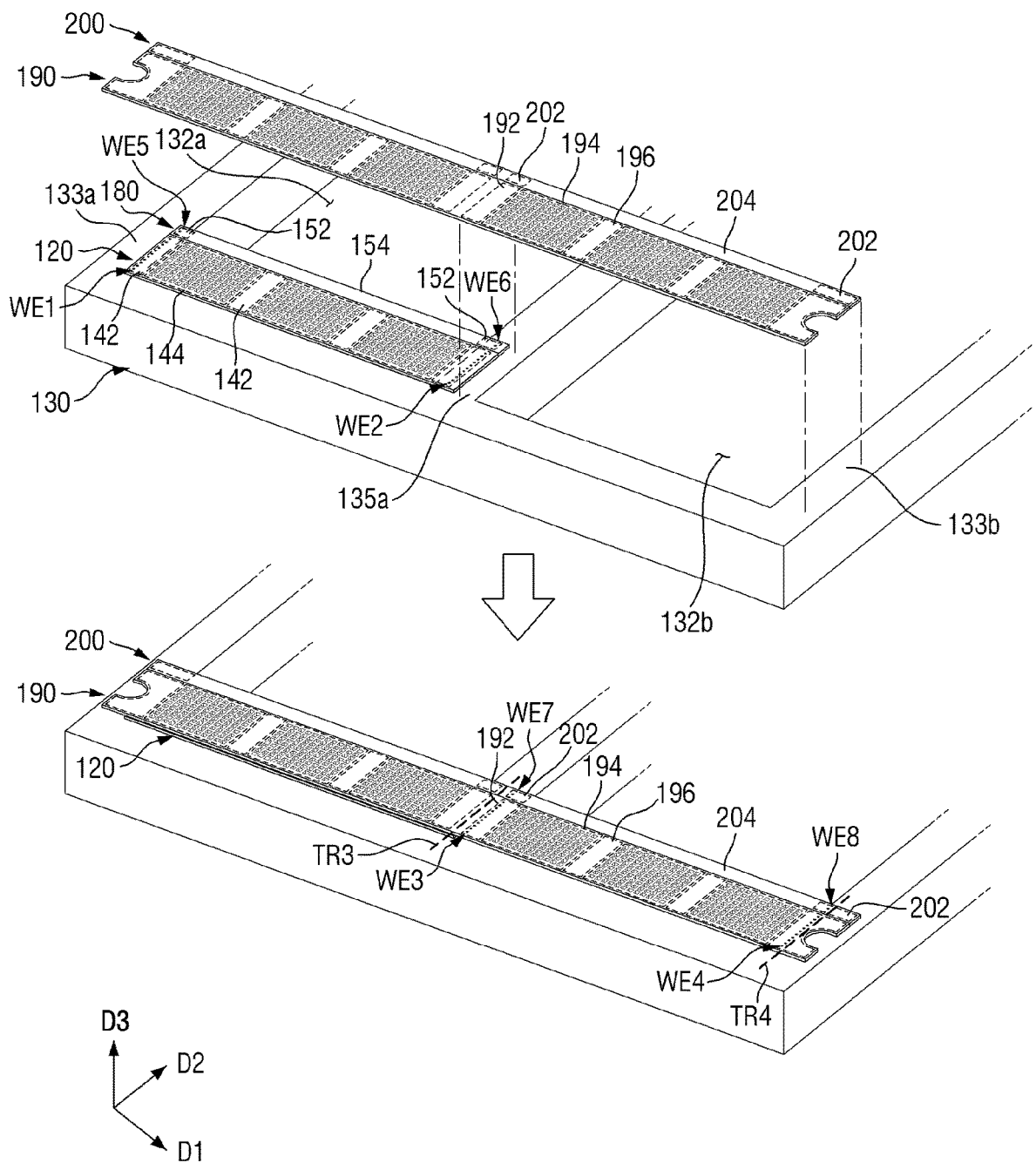

FIGS. 7 to 9 are views illustrating steps of a method of manufacturing a mask assembly according to an embodiment. FIGS. 10 to 12 are views illustrating steps of a method of manufacturing a mask assembly according to another embodiment.

Referring to FIGS. 7 and 8, a method of manufacturing a mask assembly 100 according to an embodiment may include a step of preparing a plurality of split masks, gap masks, and a mask frame, a step of aligning and coupling the split masks and the gap masks, and a step of cutting the split masks and the gap masks.

The step of preparing a plurality of split masks, gap masks, and a mask frame is a step of manufacturing and preparing split masks 120, gap masks 180, and a mask frame 130. In an embodiment, the mask frame 130 is prepared, which includes a first mask opening 132a, a second mask opening 132b, a third mask opening 132c, and a fourth opening mask 132d defined by a first support part 135a extending in the first direction D1 and a second support part 135b extending in the second direction D2.

Further, the split mask 120 is prepared, which includes first fixing portions 142 disposed at a first side thereof, first deposition pattern portions 144 having a plurality of first pattern openings 145 adjacent to the first fixing portions 142, a first rib portion 146 disposed between the first deposition pattern portions 144, second fixing portions 162 disposed at a second side thereof, second deposition pattern portions 164 having a plurality of second pattern openings 165 adjacent to the second fixing portions 162, and a second rib portion 166 disposed between the second deposition pattern portions 164.

A process for forming a deposition pattern portion is performed on each of the first deposition pattern portion 144 and the second deposition pattern portion 164 of the split mask 120. For example, the plurality of first pattern openings 145 of the first deposition pattern portion 144 may be formed by applying a photoresist to the first deposition pattern portion 144 and performing exposure, development, and etching processes. Further, the plurality of second pattern openings 165 of the second deposition pattern portion 164 may be formed by applying a photoresist to the second deposition pattern portion 164 and performing exposure, development, and etching processes. In an embodiment, the first pattern openings 145 of the deposition pattern portion 144 and the second pattern openings 165 of the second deposition pattern portion 164 may be formed, respectively, by separate processes.

Further, the gap mask 180 is prepared, which includes third fixing portions 152 disposed at a first side thereof, fourth fixing portions 172 disposed at a second side thereof, and a first blocking portion 154 and a second blocking portion 174 disposed between the third fixing portions 152 and the fourth fixing portions 172, respectively.

The step of aligning and coupling the split masks and the gap masks is a step of aligning the split masks 120 and the gap masks 180 on the mask frame 130 and then coupling them.

As shown in FIG. 8, the split masks 120 and the gap masks 180 are aligned on the mask frame 130. The split masks 120 and the gap masks 180 are disposed to overlap the first mask opening 132a and the second mask opening 132b of the mask frame 130. Although not illustrated, the split masks 120 and the gap masks 180 may also be disposed to overlap the third mask opening 132c and the fourth mask opening 132d of the mask frame 130.

In this case, each of the split mask 120 and the gap mask 180 may be tensioned by fixing both ends thereof by clamping. For example, a tensile force may be applied to the split mask 120 and the gap mask 180 in the second direction D2 by clamping.

Then, referring to FIG. 9, the split masks 120 and the gap masks 180 aligned on the mask frame 130 are welded and coupled to the mask frame 130.

In an embodiment, a first welding portion WE1 is formed by performing welding on the first fixing portion 142 of the split mask 120 overlapping the first side 133a of the mask frame 130, thereby coupling the first side of the split mask 120 with the mask frame 130. At the same time, for example, a fifth welding portion WE5 is formed by performing welding on the third fixing portion 152 of the gap mask 180 overlapping the first side 133a of the mask frame 130, thereby coupling the first side of the gap mask 180 with the mask frame 130.

Then, a second welding portion WE2 is formed by performing welding on the first fixing portion 142 of the split mask 120 overlapping the first support part 135a of the mask frame 130, thereby coupling a portion of the split mask 120 with the mask frame 130. At the same time, for example, a sixth welding portion WE6 is formed by performing welding on the third fixing portion 152 of the gap mask 180 overlapping the first support part 135a of the mask frame 130, thereby coupling a portion of the gap mask 180 with the mask frame 130.

Subsequently, a third welding portion WE3 is formed by performing welding on a second fixing portion 162 of the split mask 120 overlapping the first support part 135a of the mask frame 130, thereby coupling a portion of the split mask 120 with the mask frame 130. At the same time, for example, a seventh welding portion WE7 is formed by performing welding on the fourth fixing portion 172 of the gap mask 180 overlapping the first support part 135a of the mask frame 130, thereby coupling a portion of the gap mask 180 with the mask frame 130.

Then, a fourth welding portion WE4 is formed by performing welding on the second fixing portion 162 of the split mask 120 overlapping the second side 133b of the mask frame 130, thereby coupling a portion of the split mask 120 with the mask frame 130. At the same time, for example, an eighth welding portion WE8 is formed by performing welding on the fourth fixing portion 172 of the gap mask 180 overlapping the second side 133b of the mask frame 130, thereby coupling a portion of the gap mask 180 with the mask frame 130.

The step of cutting the split masks and the gap masks is a step of cutting the split mask 120 and the gap mask 180.

As shown in FIG. 9, first cutting TR1 is performed on one side of the split mask 120 overlapping the first side 133a of the mask frame 130, for example, between the first welding portion WE1 of the split mask 120 and one side of the split mask 120. At the same time, for example, first cutting TR1 is performed on one side of the gap mask 180 overlapping the first side 133a of the mask frame 130, for example, between the fifth welding portion WE5 of the gap mask 180 and one side of the gap mask 180.

In an embodiment, cutting may be performed using a knife or a laser.

Subsequently, second cutting TR2 is performed on a portion of the split mask 120 overlapping the first support part 135a of the mask frame 130, for example, between the second welding portion WE2 and the third welding portion WE3 of the split mask 120. At the same time, for example, second cutting TR2 is performed on a portion of the gap mask 180 overlapping the first support part 135a of the mask frame 130, for example, between the sixth welding portion WE6 and the seventh welding portion WE7 of the gap mask 180.

Then, third cutting TR3 is performed on the other side of the split mask 120 overlapping the second side 133b of the mask frame 130, for example, between the fourth welding portion WE4 of the split mask 120 and the other side of the split mask 120. At the same time, for example, third cutting TR3 is performed on the other side of the gap mask 180 overlapping the second side 133b of the mask frame 130, for example, between the eighth welding portion WE8 of the gap mask 180 and the other side of the gap mask 180.

As a result, as shown in FIG. 3, the first split mask 140 and the first gap mask 150 overlapping the first mask opening 132a of the mask frame 130 may be formed, and the second split mask 160 and the second gap mask 170 overlapping the second mask opening 132b of the mask frame 130 may be formed, thereby manufacturing the mask assembly 100.

In the above-described embodiment, through three cutting processes, the split mask 120 may be divided into the first split mask 140 and the second split mask 160 to be separated from each other, and the gap mask 180 may be divided into the first gap mask 150 and the second gap mask 170 to be separated from each other.

Herein, a method of manufacturing the mask assembly 100 according to another embodiment will be described. In the following embodiment, a repeated description of the same processes as in FIGS. 7 to 9 may be omitted.

As described above with reference to FIGS. 7 to 8, the split mask 120 and the gap mask 180 are aligned and disposed on the mask frame 130.

Then, referring to FIG. 10, a first welding portion WE1 is formed by performing welding on the first fixing portion 142 of the split mask 120 overlapping the first side 133a of the mask frame 130, thereby coupling a first side of the split mask 120 with the mask frame 130. At the same time, for example, a fifth welding portion WE5 is formed by performing welding on the third fixing portion 152 of the gap mask 180 overlapping the first side 133a of the mask frame 130, thereby coupling a first side of the gap mask 180 with the mask frame 130.

Then, a second welding portion WE2 is formed by performing welding on the first fixing portion 142 of the split mask 120 overlapping the first support part 135a of the mask frame 130, thereby coupling a portion of the split mask 120 with the mask frame 130. At the same time, for example, a sixth welding portion WE6 is formed by performing welding on the third fixing portion 152 of the gap mask 180 overlapping the first support part 135a of the mask frame 130, thereby coupling a portion of the gap mask 180 with the mask frame 130.

Then, first cutting TR1 is performed on one side of the split mask 120 overlapping the first side 133a of the mask frame 130, for example, between the first welding portion WE1 of the split mask 120 and the first side of the split mask 120. At the same time, for example, first cutting TR1 is performed on one side of the gap mask 180 overlapping the first side 133a of the mask frame 130, for example, between the fifth welding portion WE5 of the gap mask 180 and the first side of the gap mask 180. In an embodiment, cutting may be performed using a knife or a laser.

Subsequently, second cutting TR2 is performed on a portion of the split mask 120 overlapping the first support part 135a of the mask frame 130, for example, between the second welding portion WE2 and the third welding portion WE3 of the split mask 120. At the same time, for example, second cutting TR2 is performed a portion of the gap mask 180 overlapping the first support part 135a of the mask frame 130, for example, between the sixth welding portion WE6 and the seventh welding portion WE7 of the gap mask 180.

Then, referring to FIG. 11, the remaining portion of the split mask not coupled with the mask frame 130 is removed by the second cutting TR2. Accordingly, the first split mask 140 and the first gap mask 180 may be coupled on the mask frame 130. In the present embodiment, the portion of the split mask overlapping the second mask opening 132b is removed since the alignment of the deposition pattern portion overlapping the first mask opening 132a and the alignment of the deposition pattern portion overlapping the second mask opening 132b may be different from each other since the pattern openings of the deposition pattern portion of the split mask may be formed by two separate processes.

Then, referring to FIG. 12, a prepared third split mask 190 may be superimposed and aligned on the mask frame 130 to which the first split mask 140 is coupled and a third gap mask 200 is superimposed and aligned on the mask frame 130 to which the first gap mask 150 is coupled. That is, the third split mask 190 is aligned so as to overlap the first split mask 140, and the third gap mask 200 is aligned so as to overlap the first gap mask 150. In an embodiment, the third split mask 190 may be the same mask as the above-described split mask 120, and the third gap mask 200 may also be the same mask as the above-described gap mask 180.

Subsequently, a third welding portion WE3 is formed by performing welding on a fifth fixing portion 192 of the third split mask 190 overlapping the first support part 135a of the mask frame 130, thereby coupling a portion of the third split mask 190 with the mask frame 130. At the same time, for example, a seventh welding portion WE7 is formed by performing welding on a sixth fixing portion 202 of the third gap mask 200 overlapping the first support part 135a of the mask frame 130, thereby coupling a portion of the third gap mask 200 with the mask frame 130.

Then, a fourth welding portion WE4 is formed by performing welding on the fifth fixing portion 192 of the third split mask 190 overlapping the second side 133b of the mask frame 130, thereby coupling a portion of the third split mask 190 with the mask frame 130. At the same time, for example, an eighth welding portion WE8 is formed by performing welding on a sixth fixing portion 202 of the third gap mask 200 overlapping the second side 133b of the mask frame 130, thereby coupling a portion of the third gap mask 200 with the mask frame 130.

Subsequently, third cutting TR3 is performed on a portion of the third split mask 190 overlapping the first support part 135a of the mask frame 130, for example, between the third welding portion WE3 of the third split mask 190 and the second welding portion WE2 of the first split mask 140. At the same time, for example, third cutting TR3 is performed on a portion of the third gap mask 200 overlapping the first support part 135a of the mask frame 130, for example, between the seventh welding portion WE7 of the third gap mask 200 and the sixth welding portion WE6 of the first gap mask 180.

Then, fourth cutting TR4 is performed on the second side of the third split mask 190 overlapping the second side 133b of the mask frame 130, for example, between the fourth welding portion WE4 of the third split mask 190 and the second side of the third split mask 190. At the same time, for example, fourth cutting TR4 is performed on the second side of the third gap mask 200 overlapping the second side 133b of the mask frame 130, for example, between the eighth welding portion WE8 of the third gap mask 200 and the second side of the third gap mask 200.

As a result, as shown in FIG. 3, the first split mask 140 and the second split mask 160 made of the third split mask may be coupled on the mask frame 130. Further, the first gap mask 150 and the second gap mask 170 made of the third gap mask may be coupled on the mask frame 130.

In the above-described embodiment, through four cutting processes, the split mask 120 may be divided into the first split mask 140 and the second split mask 160 to be separated from each other, and the gap mask 180 may be divided into the first gap mask 150 and the second gap mask 170 to be separated from each other.

Figure 13:
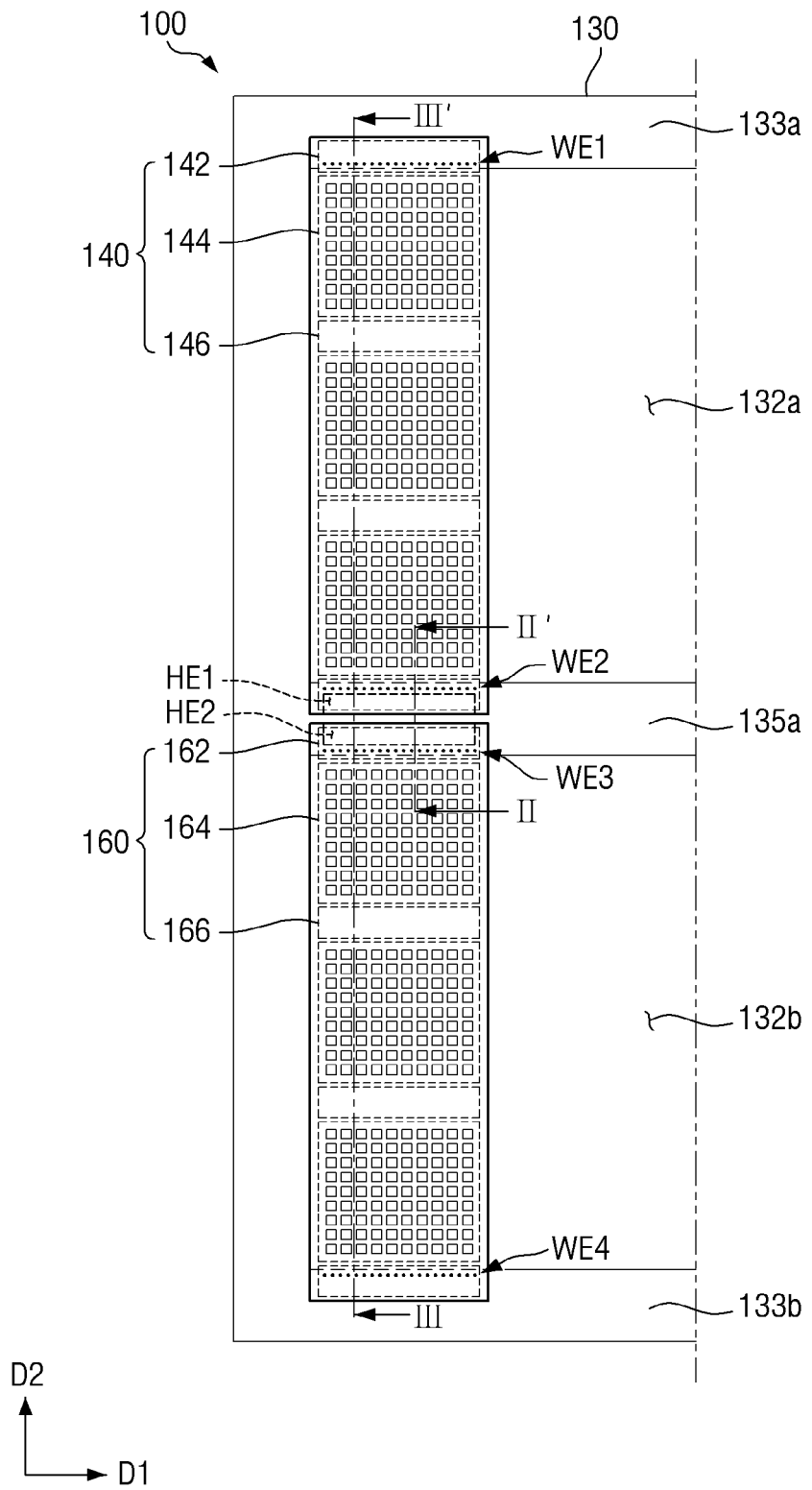
FIG. 13 is a plan view schematically showing a mask assembly according to another embodiment.
Figure 14:
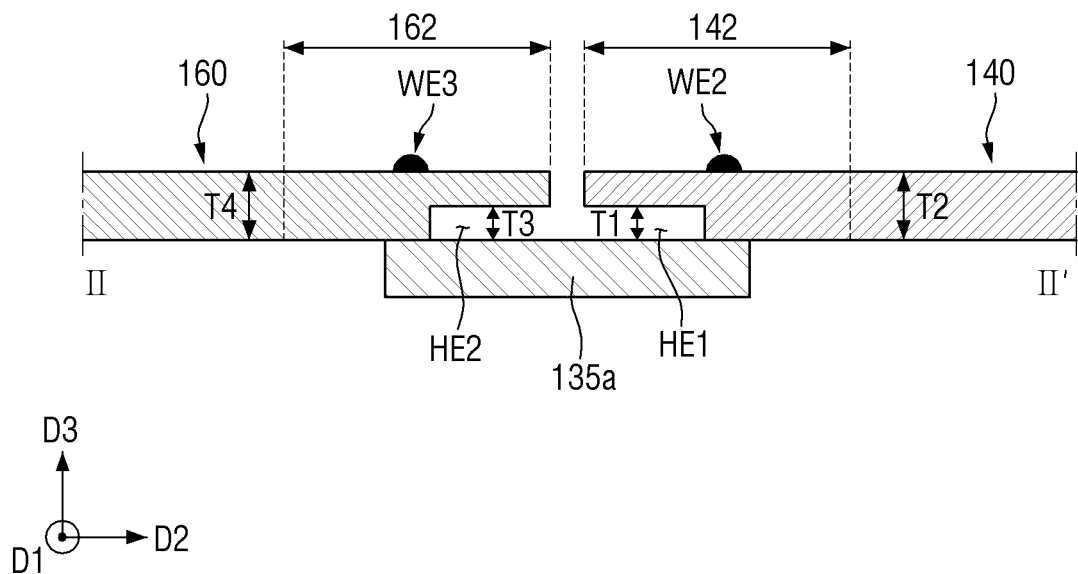
FIG. 14 is a cross-sectional view schematically showing a structure taken along the line II-II' of FIG. 13.
Figure 15:
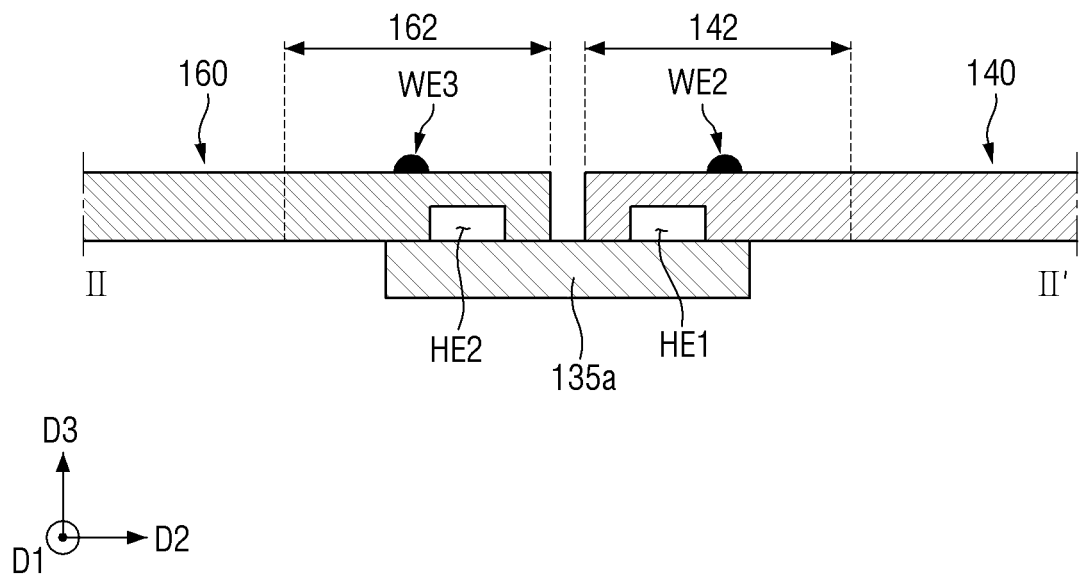
FIG. 15 is a cross-sectional view schematically showing a structure according to another embodiment, taken along the line II-II' of FIG. 13.
Figure 16:
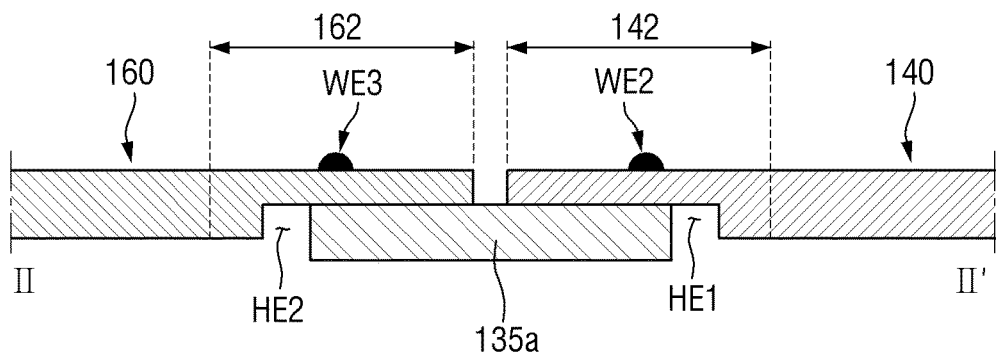
FIG. 16 is a cross-sectional view schematically showing a structure according to another embodiment, taken along the line II-II' of FIG. 13.
Figure 16:
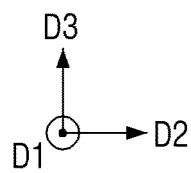
Figure 17:
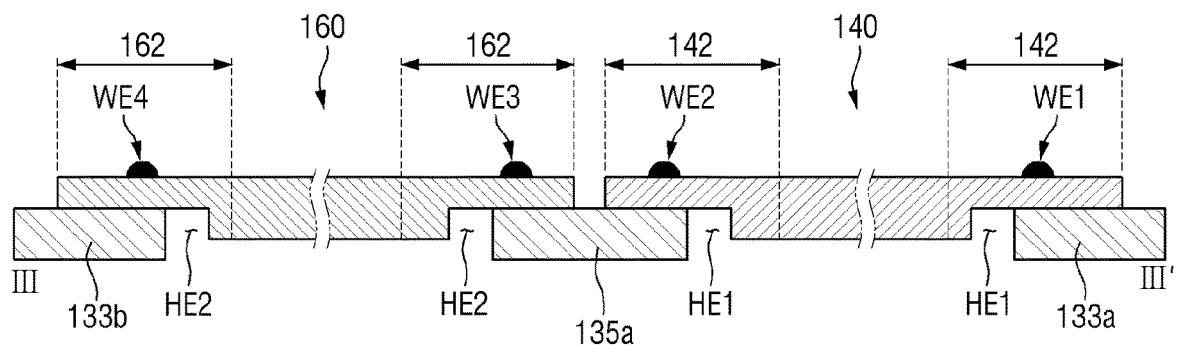
FIG. 17 is a cross-sectional view schematically showing a structure taken along the line III-III' of FIG. 13.
Figure 17:
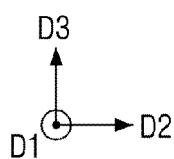

FIG. 13 is a plan view schematically showing a mask assembly according to another embodiment; and FIG. 14 is a cross-sectional view schematically showing a structure taken along the line II-II' of FIG. 13. FIG. 15 is a cross-sectional view schematically showing a structure according to another embodiment, taken along the line II-II' of FIG. 13. FIG. 16 is a cross-sectional view schematically showing a structure according to another embodiment, taken along the line II-II' of FIG. 13. FIG. 17 is a cross-sectional view schematically showing a structure taken along the line III-III' of FIG. 13.

Referring to FIGS. 13 to 17, the mask assembly 100 according to an embodiment may include the first split mask 140 and the second split mask 160 coupled on the mask frame 130. In particular, the embodiment of FIGS. 13 to 17 has a difference from the above-described embodiment of FIGS. 3 to 12 in that it further includes half-etched portions HE1 and HE2, and configurations of the other portions may be substantially the same or similar. Thus, a redundant description may be omitted and differences will be mainly described.

Referring to FIGS. 13 to 14, the mask assembly 100 according to an embodiment may include the first split mask 140 and the second split mask 160 coupled to the mask frame 130. The first split mask 140 may overlap the first mask opening 132a, a first end of the first split mask 140 may be coupled to the first side 133a of the mask frame 130, and a second end of the first split mask 140 may be coupled to the first support part 135a of the mask frame 130. The second split mask 160 may overlap the second mask opening 132b, a first end of the second split mask 160 may be coupled to the first support part 135a of the mask frame 130, and a second end of the second split mask 160 may be coupled to the second side 133b of the mask frame 130.

The first split mask 140 may include a first half-etched portion HE1 in the first fixing portion 142 overlapping the first support part 135a of the mask frame 130. The second split mask 160 may include a second half-etched portion HE2 in the second fixing portion 162 overlapping the first support part 135a of the mask frame 130. The first half-etched portion HE1 may be a groove that is partially etched in the thickness direction of the first split mask 140, and the second half-etched portion HE2 may be a groove that is partially etched in the thickness direction of the second split mask 160.

The first half-etched portion HE1 and the second half-etched portion HE2 may serve to balance the volume of each region of the split masks 140 and 160. In the first split mask 140, the first deposition pattern portions 144 may be disposed at a central portion thereof, and thus may have a volume difference from one end where the first fixing portion 142 is disposed. If there is a volume difference for each region in the first split mask 140, deformation such as bending may occur in the first split mask 140 due to the volume difference. Thus, deformation of the first split mask 140 can be prevented or substantially prevented by forming the first half-etched portion HE1 on one end of the first split mask 140. Similarly, the second split mask 160 may also include the second half-etched portion HE2.

The first half-etched portion HE1 of the first split mask 140 may overlap the first fixing portion 142 of the first split mask 140, and overlap the first support part 135a of the mask frame 130. In an embodiment, a thickness T1 of the first half-etched portion HE1 may be approximately 50% of a thickness T2 of the first split mask 140. In an embodiment, the thickness T1 of the first half-etched portion HE1 may be 30% to 70% of the thickness T2 of the first split mask 140.

Similarly, the second half-etched portion HE2 of the second split mask 160 may overlap the second fixing portion 162 of the second split mask 160, and overlap the first support part 135a of the mask frame 130. In an embodiment, a thickness T3 of the second half-etched portion HE2 may be approximately 50% of a thickness T4 of the second split mask 160. In an embodiment, the thickness T3 of the second half-etched portion HE2 may be 30% to 70% of the thickness T4 of the second split mask 160.

As illustrated in FIG. 14, the first half-etched portion HE1 may not overlap the second welding portion WE2, and the second half-etched portion HE2 may not overlap the third welding portion WE3. However, the present embodiment is not limited thereto. The first half-etched portion HE1 may overlap the second welding portion WE2, and the second half-etched portion HE2 may overlap the third welding portion WE3.

In an embodiment, the first half-etched portion HE1 may be formed to have a shape etched from one side of the first split mask 140 toward the center of the first split mask 140, and the second half-etched portion HE2 may be formed to have a shape etched from one side of the second split mask 160 toward the center of the second split mask 160.

As shown in FIG. 15, in another embodiment, the first half-etched portion HE1 may be disposed to be spaced apart from one side of the first split mask 140, and the second half-etched portion HE2 may be disposed to be spaced apart from one side of the second split mask 160. In an embodiment, the first half-etched portion HE1 may not overlap the second welding portion WE2 and may overlap the first fixing portion 142, and the second half-etched portion HE2 may not overlap the third welding portion WE3 and may overlap the second fixing portion 162.

As shown in FIG. 16, in another embodiment, the first half-etched portion HE1 may be in direct contact with the first support part 135a of the mask frame 130, and the second half-etched portion HE2 may be in direct contact with the first support part 135a of the mask frame 130. In this case, the first half-etched portion HE1 may overlap the second welding portion WE2 and the first fixing portion 142, and the second half-etched portion HE2 may overlap the third welding portion WE3 and the second fixing portion 162. In the present embodiment, since the half-etched portions HE1 and HE2 are in direct contact with the first support part 135a, welding may be performed under weak conditions to couple the split mask to the mask frame 130.

As illustrated in FIG. 17, in another embodiment, the first half-etched portions HE1 of the first split mask 140 may be disposed at both ends of the first split mask 140, respectively. The first half-etched portion HE1 disposed at one end of the first split mask 140 may overlap the first side 133a of the mask frame 130 and may overlap the first welding portion WE1. The first half-etched portion HE1 disposed at the other end of the first split mask 140 may overlap the first support part 135a of the mask frame 130 and may overlap the second welding portion WE2 of the first split mask 140.

The second half-etched portion HE2 disposed at one end of the second split mask 160 may overlap the first support part 135a of the mask frame 130 and may overlap the third welding portion WE3. The second half-etched portion HE2 disposed at the other end of the second split mask 160 may overlap the second side 133b of the mask frame 130 and may overlap the fourth welding portion WE4.

As described above, the embodiments shown in FIGS. 13 to 17 may include the half-etched portion in the split mask to prevent or substantially prevent deformation of the split mask due to a volume difference.

Figure 18:
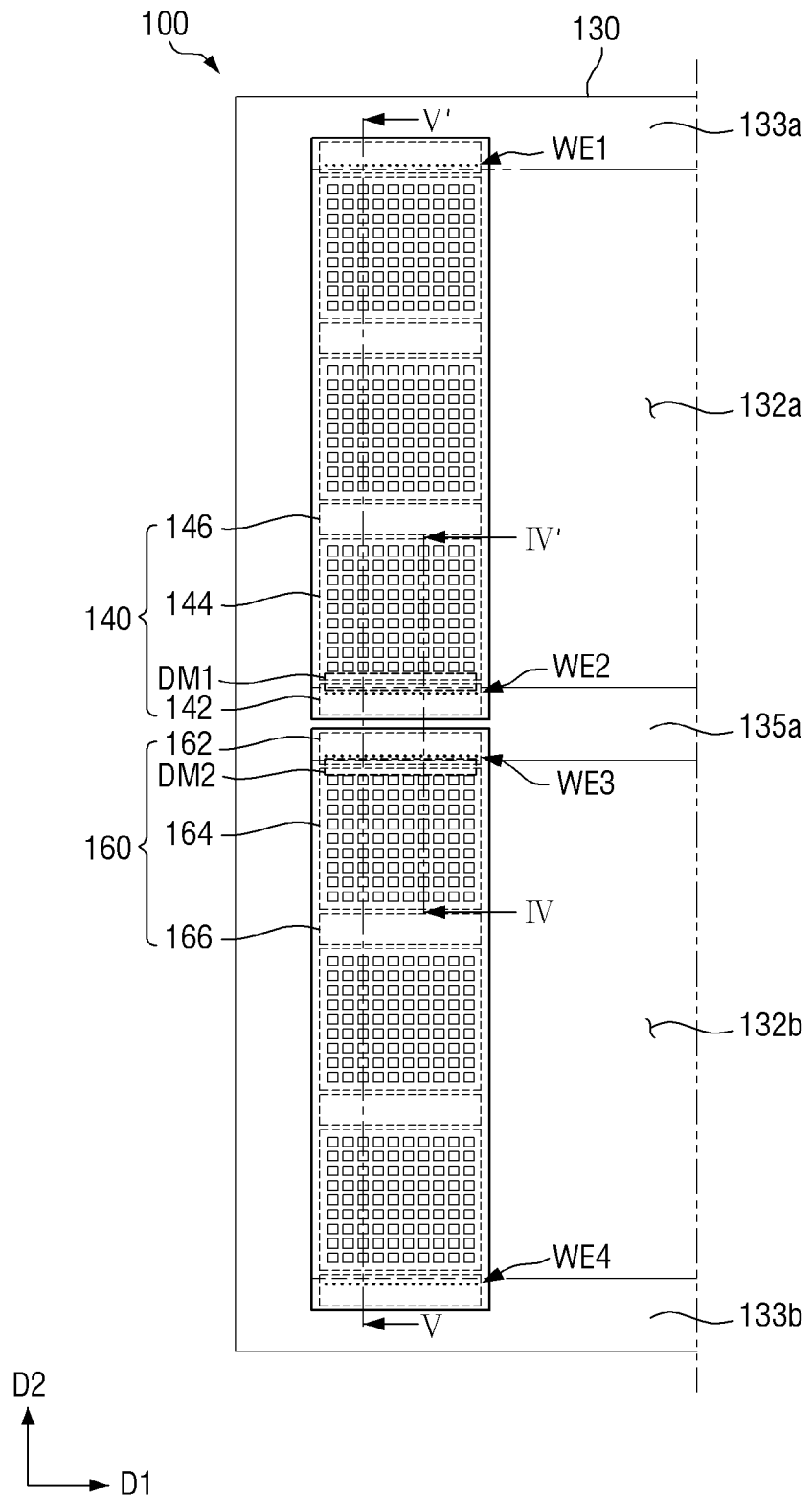
FIG. 18 is a plan view schematically showing a mask assembly according to another embodiment.
Figure 19:
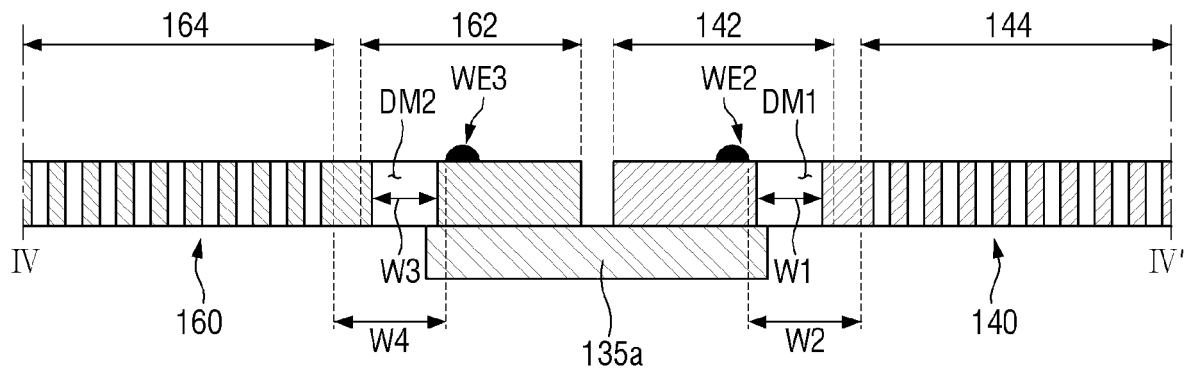
FIG. 19 is a cross-sectional view schematically showing a structure taken along the line IV-IV' of FIG. 18.
Figure 19:
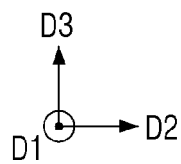
Figure 20:
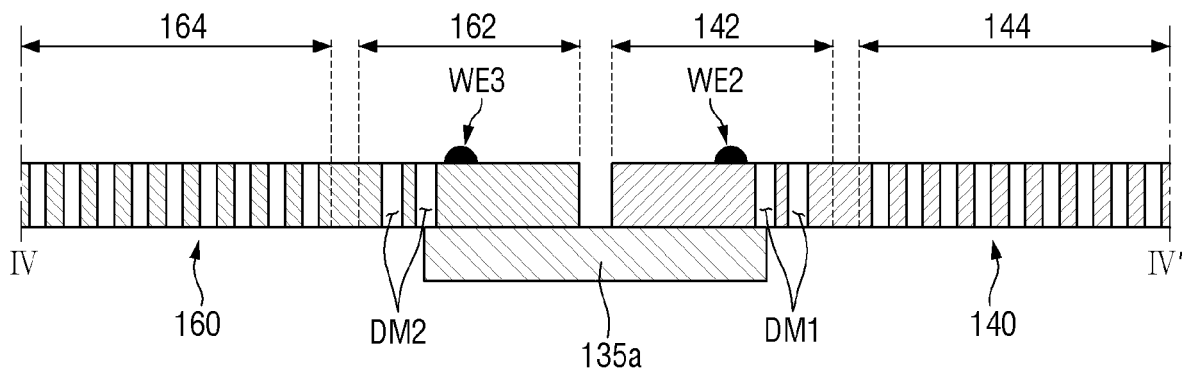
FIG. 20 is a cross-sectional view schematically showing a structure according to another embodiment, taken along the line IV-IV' of FIG. 18.
Figure 20:
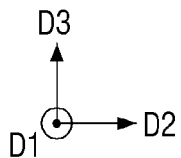
Figure 21:
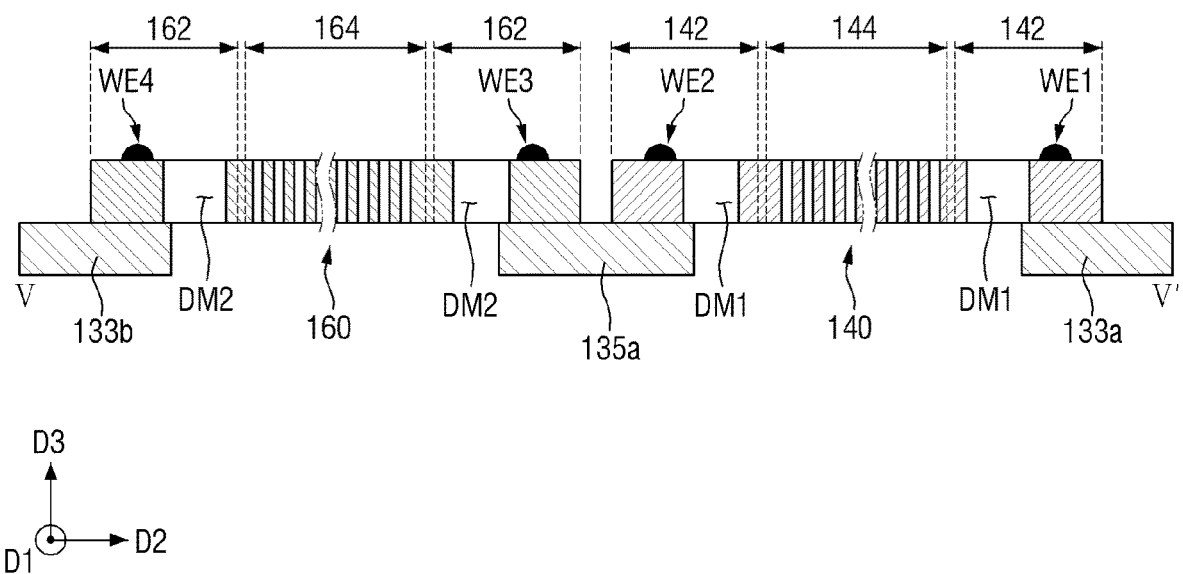
FIG. 21 is a cross-sectional view schematically showing a structure taken along the line V-V' of FIG. 18.

FIG. 18 is a plan view schematically showing a mask assembly according to another embodiment; and FIG. 19 is a cross-sectional view schematically showing a structure taken along the line IV-IV' of FIG. 18. FIG. 20 is a cross-sectional view schematically showing a structure according to another embodiment, taken along the line IV-IV' of FIG. 18. FIG. 21 is a cross-sectional view schematically showing a structure taken along the line V-V' of FIG. 18.

Referring to FIGS. 18 to 21, the mask assembly 100 according to an embodiment may include the first split mask 140 and the second split mask 160 coupled on the mask frame 130. In particular, the embodiment of FIGS. 18 to 21 has a difference from the above-described embodiments of FIGS. 3 to 17 in that it further includes dummy pattern portions DM1 and DM2, and configurations of the other portions may be substantially the same or similar. Thus, a redundant description may be omitted and differences will be mainly described.

Referring to FIGS. 18 and 19, the mask assembly 100 according to an embodiment may include the first split mask 140 and the second split mask 160 coupled to the mask frame 130. The first split mask 140 may overlap the first mask opening 132a, a first end of the first split mask 140 may be coupled to the first side 133a of the mask frame 130, and a second end of the first split mask 140 may be coupled to the first support part 135a of the mask frame 130. The second split mask 160 may overlap the second mask opening 132b, a first end of the second split mask 160 may be coupled to the first support part 135a of the mask frame 130, and a second end of the second split mask 160 may be coupled to the second side 133b of the mask frame 130.

The first split mask 140 may include a first dummy pattern portion DM1 in the first fixing portion 142 overlapping the first support part 135a of the mask frame 130. The second split mask 160 may include a second dummy pattern portion DM2 in the second fixing portion 162 overlapping the first support part 135a of the mask frame 130. The first dummy pattern portion DM1 may be a hole passing through the first split mask 140. The second dummy pattern portion DM2 may be a hole passing through the second split mask 160.

The first dummy pattern portion DM1 and the second dummy pattern portion DM2 may serve to block deformation from extending to the center of the split masks 140 and 160 due to deformation such as bending due to a difference in volume of each region of the split masks 140 and 160. In the first split mask 140, the first deposition pattern portions 144 may be disposed at a central portion thereof, and thus may have a volume difference from one end where the first fixing portion 142 is disposed. If there is a volume difference for each region in the first split mask 140, deformation such as bending may occur in the first split mask 140 due to the volume difference. Thus, deformation of the first split mask 140 can be prevented or substantially prevented from extending to the central portion thereof by forming the first dummy pattern portion DM1 at one end of the first split mask 140. Similarly, the second split mask 160 may also include the second dummy pattern portion DM2.

The first dummy pattern portion DM1 of the first split mask 140 may overlap the first fixing portion 142 of the first split mask 140, and may be disposed between the second welding portion WE2 and the first deposition pattern portion 144 of the first split mask 140. The first dummy pattern portion DM1 may overlap the first support part 135a of the mask frame 130. The position of the first dummy pattern portion DM1 is not particularly limited as long as it is disposed between the second welding portion WE2 and the first deposition pattern portion 144 of the first split mask 140.

A width W1 of the first dummy pattern portion DM1 may be smaller than a width W2 between the second welding portion WE2 and the first deposition pattern portion 144 of the first split mask 140. Therefore, the first dummy pattern portion DM1 may prevent or substantially prevent bending generated from the second welding portion WE2 from extending to the first deposition pattern portion 144.

Similarly, the second dummy pattern portion DM2 of the second split mask 160 may overlap the second fixing portion 162 of the second split mask 160, and may be disposed between the third welding portion WE3 and the second deposition pattern portion 164 of the second split mask 160.

The second dummy pattern portion DM2 may overlap the first support part 135a of the mask frame 130. The position of the second dummy pattern portion DM2 is not particularly limited as long as it is disposed between the third welding portion WE3 and the second deposition pattern portion 164 of the second split mask 160.

A width W3 of the second dummy pattern portion DM2 may be smaller than a width W4 between the third welding portion WE3 and the second deposition pattern portion 164 of the second split mask 160. Therefore, the second dummy pattern portion DM2 may prevent or substantially prevent the bending generated from the third welding portion WE3 from extending to the second deposition pattern portion 164.

As shown in FIG. 20, in another embodiment, two or more first dummy pattern portions DM1 and two or more second dummy pattern portions DM2 may be disposed. As long as the first dummy pattern portion DM1 is disposed between the second welding portion WE2 and the first deposition pattern portion 144 of the first split mask 140, the first dummy pattern portion DM1 may be provided in plural, and the number thereof is not particularly limited. Similarly, as long as the second dummy pattern portion DM2 is disposed between the third welding portion WE3 and the second deposition pattern portion 164 of the second split mask 160, the second dummy pattern portion DM2 may be provided in plural, and the number thereof is not particularly limited.

As shown in FIG. 21, in an embodiment, the first dummy pattern portions DM1 may be disposed at both ends of the first split mask 140, respectively. The first dummy pattern portion DM1 disposed at one end of the first split mask 140 may overlap the first side 133a of the mask frame 130 and may not overlap the first welding portion WE1. The first dummy pattern portion DM1 may be disposed between the first welding portion WE1 and the first deposition pattern portion 144 of the first split mask 140. The first dummy pattern portion DM1 disposed at the other end of the first split mask 140 may overlap the first support part 135a of the mask frame 130 and may not overlap the second welding portion WE2 of the first split mask 140. The first dummy pattern portion DM1 may be disposed between the second welding portion WE2 and the first deposition pattern portion 144 of the first split mask 140.

Similarly, the second dummy pattern portions DM2 may be disposed at both ends of the second split mask 160, respectively. The second dummy pattern portion DM2 disposed at one end of the second split mask 160 may overlap the first side 133a of the mask frame 130 and may not overlap the third welding portion WE3. The second dummy pattern portion DM2 may be disposed between the third welding portion WE3 and the second deposition pattern portion 164 of the second split mask 160. The second dummy pattern portion DM2 disposed at the other end of the second split mask 160 may overlap the second side 133b of the mask frame 130 and may not overlap the fourth welding portion WE4. The second dummy pattern portion DM2 may be disposed between the fourth welding portion WE4 and the second deposition pattern portion 164 of the second split mask 160.

As described above, the embodiments illustrated in FIGS. 18 to 21 may include the dummy pattern portion in the split mask to prevent or substantially prevent deformation of the split mask due to a volume difference from extending to the deposition pattern portion.

Figure 22:
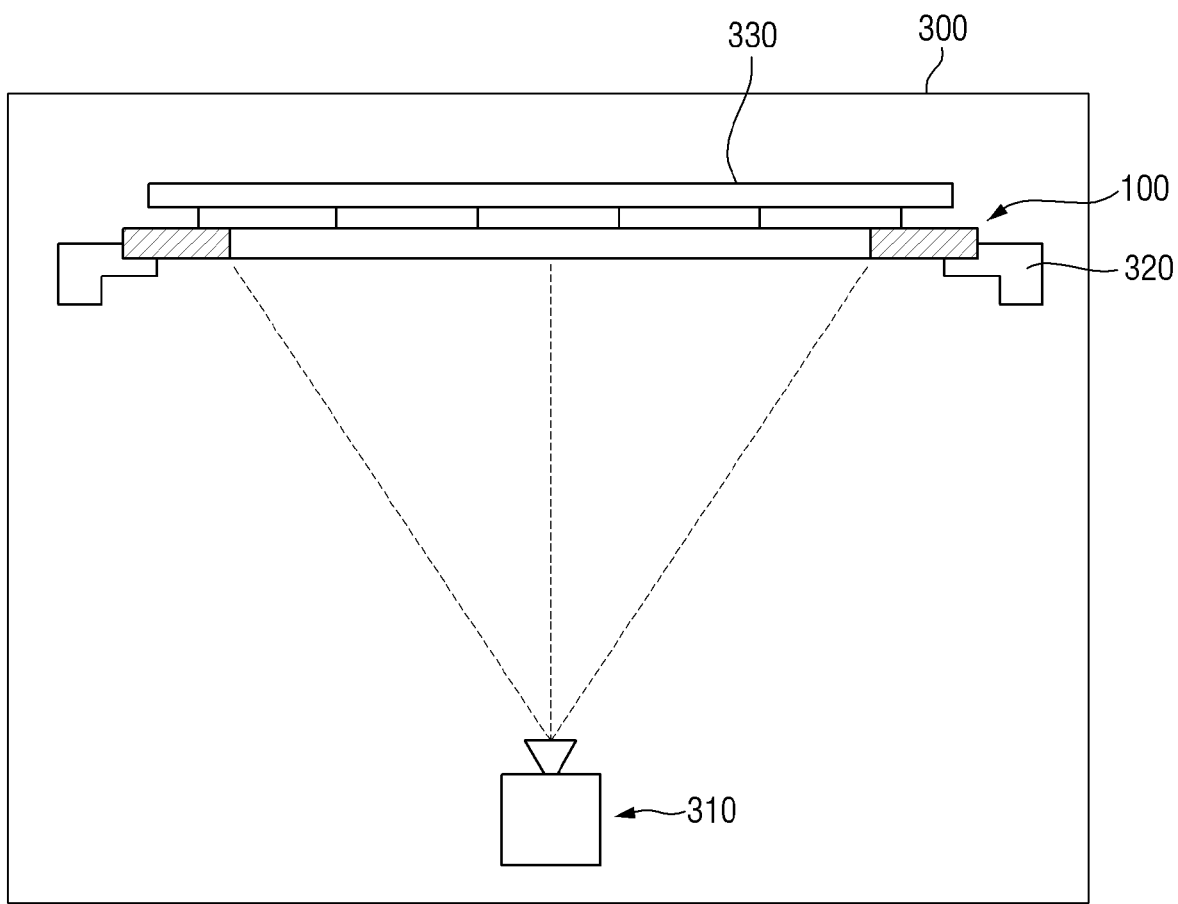
FIG. 22 is a view schematically illustrating a deposition process using a mask assembly according to an embodiment.

FIG. 22 is a view schematically illustrating a deposition process using a mask assembly according to an embodiment.

Referring to FIG. 22, a process of depositing an electrode or an organic light emitting layer of an organic light emitting display device may be performed in a vacuum chamber 300.

A deposition source 310 may be disposed at a lower portion inside the vacuum chamber 300. The deposition source 310 may be, for example, a crucible as a container in which a deposition material is contained. The mask assembly 100 according to an embodiment may be mounted by a support 320 on an upper side inside the vacuum chamber 300 facing the deposition source 310. A substrate 330, for example, a substrate 330 for manufacturing an organic light emitting display device may be disposed on the mask assembly 100. In an embodiment, the mask assembly 100 and the substrate 330 may be in direct contact with each other.

When the deposition material evaporates toward the mask assembly 100 in the deposition source 310 in the vacuum chamber 300 described above, the deposition material may be deposited in a pattern shape on a region of the substrate 330 through the deposition pattern portions 144 and 164, respectively, formed in the split masks 140 and 160 (see FIG. 3) formed in the mask assembly 100.

The mask assembly 100 according to the above-described embodiments may include the first split mask and the second split mask to deposit the deposition material on the large-area substrate 330. Further, it is possible to prevent or substantially prevent deformation of the split mask due to the volume difference for each region of the split mask by including the half-etched portion. Further, it is possible to prevent or substantially prevent bending of the split mask from extending to a central portion thereof due to the volume difference for each region of the split mask by including the dummy pattern portion.

Figure 23:
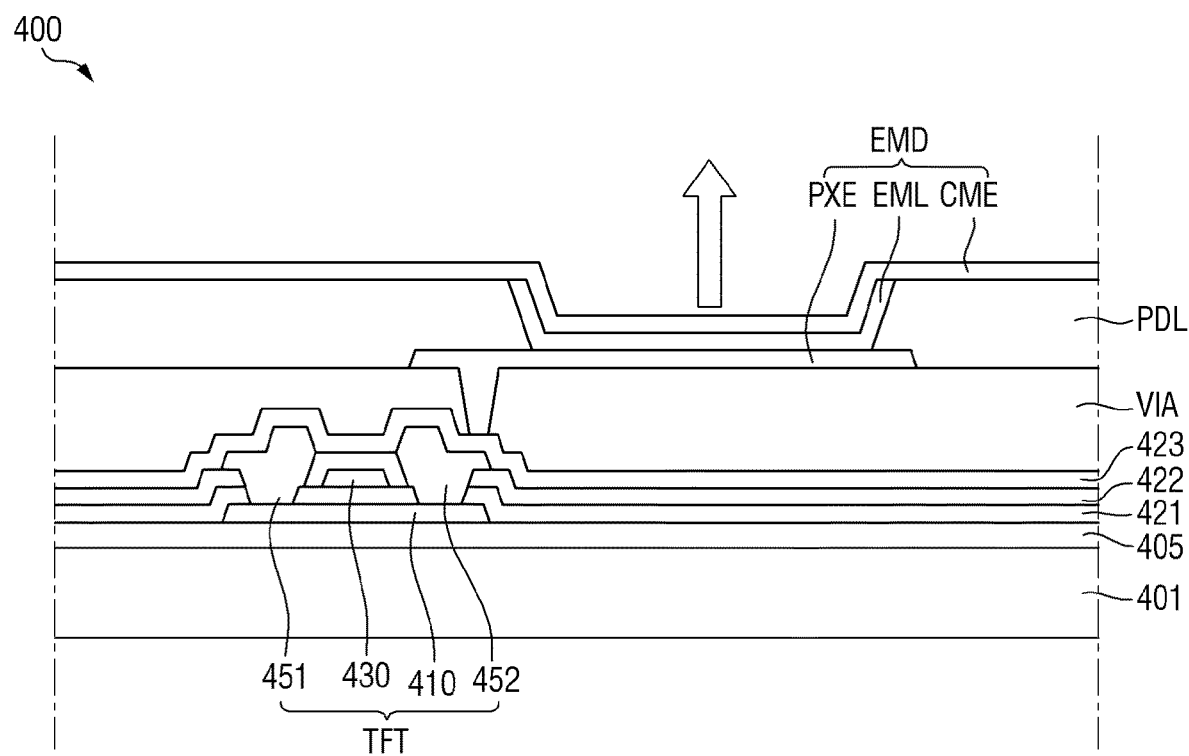
FIG. 23 is a cross-sectional view schematically showing an organic light emitting display device according to an embodiment.

FIG. 23 is a cross-sectional view schematically showing an organic light emitting display device manufactured using the mask assembly according to an embodiment.

FIG. 23 illustrates a top emission type display device in which light L is emitted in a direction away from a substrate 401 on which a light emitting layer EML is formed. However, the present disclosure is not limited thereto. For example, the display device may be of a bottom emission type in which light is emitted in a direction toward the substrate 401 on which the light emitting layer EML is formed, or a double-sided emission type in which light is emitted in both the direction toward the substrate 401 and the direction away from the substrate 401.

Referring to FIG. 23, an organic light emitting display device 400 may include the substrate 401. The substrate 401 may be an insulating substrate. In an embodiment, the substrate 401 may include a transparent material. For example, the substrate 401 may include a transparent insulating material, such as glass, quartz, or the like. In an embodiment, the substrate 401 may be a rigid substrate. However, the substrate 401 is not limited thereto. For example, the substrate 401 may include plastic, such as polyimide or the like, and may have a flexible property such that it can be bent, folded, or rolled.

A buffer layer 405 may be disposed on the substrate 401. The buffer layer 405 may be disposed on a surface of the substrate 401 to protect a thin film transistor TFT and a light emitting element EMD from moisture penetrating through the substrate 401 susceptible to moisture permeation. In an embodiment, the buffer layer 405 may be formed of a plurality of inorganic layers that are alternately stacked. For example, the buffer layer 405 may be formed of multiple layers in which one or more inorganic layers of a silicon nitride layer, a silicon oxynitride layer, a silicon oxide layer, a titanium oxide layer, and an aluminum oxide layer are alternately stacked. In an embodiment, the buffer layer 405 may be omitted.

The thin film transistor TFT may be disposed as a driving element on the buffer layer 405. The thin film transistor TFT may include a semiconductor layer 410, a first insulating layer 421, a second insulating layer 422, and a gate electrode 430.

Although FIG. 23 illustrates that the thin film transistor TFT is formed by a top gate method in which the gate electrode 430 is located above the semiconductor layer 410, the present disclosure is not limited thereto. For example, the thin film transistor TFT may be formed by a bottom gate method in which the gate electrode 430 is located below the semiconductor layer 410, or a double gate method in which the gate electrodes 430 are located both above and below the semiconductor layer 410.

For example, the semiconductor layer 410 of the thin film transistor TFT may be disposed on the buffer layer 405. In an embodiment, the semiconductor layer 410 may include polycrystalline silicon, monocrystalline silicon, low-temperature polycrystalline silicon, amorphous silicon, or an oxide semiconductor. In an embodiment, a light blocking layer may be formed between the buffer layer 405 and the semiconductor layer 410 to block external light incident on the semiconductor layer 410.

The first insulating layer 421 may be disposed on the semiconductor layer 410. In an embodiment, the first insulating layer 421 may be formed of an inorganic layer, for example, a silicon nitride layer, a silicon oxynitride layer, a silicon oxide layer, a titanium oxide layer, or an aluminum oxide layer.

The gate electrode 430 may be disposed on the first insulating layer 421. The gate electrode 430 may overlap the semiconductor layer 410. The gate electrode 430 may be formed as a single layer or multiple layers made of any of molybdenum (Mo), aluminum (Al), chromium (Cr), gold (Au), titanium (Ti), nickel (Ni), neodymium (Nd), and copper (Cu), or an alloy thereof.

The second insulating layer 422 may be disposed on the gate electrode 430. In an embodiment, the second insulating layer 422 may be formed of an inorganic layer, for example, a silicon nitride layer, a silicon oxynitride layer, a silicon oxide layer, a titanium oxide layer, or an aluminum oxide layer.

A source electrode 451 (or a drain electrode) and a drain electrode 452 (or a source electrode) of the thin film transistor TFT may be disposed on the second insulating layer 422. The source electrode 451 and the drain electrode 452 may be connected to the semiconductor layer 410 through contact holes passing through the second insulating layer 422 and the first insulating layer 421. The source electrode 451 and the drain electrode 452 may be formed of a single layer or multiple layers made of a low resistance material, for example, any of aluminum (Al), gold (Au), and copper (Cu), or an alloy thereof.

A third insulating layer 423 may be disposed on the source electrode 451 and the drain electrode 452. The third insulating layer 423 may be a passivation layer protecting the thin film transistor TFT therebelow. In an embodiment, the third insulating layer 423 may be formed of an inorganic layer, for example, a silicon nitride layer, a silicon oxynitride layer, a silicon oxide layer, a titanium oxide layer, or an aluminum oxide layer.

A via layer VIA may be disposed on the third insulating layer 423. The via layer VIA may be a planarization layer for flattening a step due to the thin film transistor TFT. In an embodiment, the via layer VIA may include an organic insulating material selected from the group consisting of acrylic resin, epoxy resin, phenolic resin, polyamide resin, polyimide resin, unsaturated polyester resin, polyphenylene resin, polyphenylenesulfide resin, and benzocyclobutene (BCB).

The light emitting element EMD may be disposed on the via layer VIA. The light emitting element EMD may include a pixel electrode PXE, the light emitting layer EML, and a common electrode CME.

The pixel electrode PXE may be disposed on the via layer VIA. The pixel electrode PXE may be a first electrode (e.g., an anode electrode) of the light emitting element EMD. The pixel electrode PXE may be connected to the drain electrode 452 (or the source electrode) of the thin film transistor TFT through a contact hole passing through the via layer VIA.

In a top emission type structure that emits light toward the common electrode CME with respect to the light emitting layer EML, the pixel electrode PXE may be formed of a single layer of silver (Ag), molybdenum (Mo), titanium (Ti), copper (Cu), or aluminum (Al), or may be formed of a metal material having high reflectivity to have a stacked structure (Ti/Al/Ti) of aluminum and titanium, a stacked structure (ITO/Ag/ITO) of silver and ITO, an APC alloy, or a stacked structure (ITO/APC/ITO) of an APC alloy and ITO. The APC alloy is an alloy of silver (Ag), palladium (Pd) and copper (Cu).

As another example, in a bottom emission type structure that emits light toward the pixel electrode PXE with respect to the light emitting layer EML, the pixel electrode PXE may be formed of a transparent metal material (transparent conductive material, TCO), such as indium tin oxide (ITO) or indium zinc oxide (IZO), capable of transmitting light therethrough, or a semi-transmissive metal material (semi-transmissive conductive material), such as magnesium (Mg), silver (Ag), or an alloy of magnesium (Mg) and silver (Ag). In this case, when the pixel electrode PXE is formed of a semi-transmissive metal material, the light emission efficiency can be increased due to a micro-cavity effect.

A pixel defining layer PDL may be disposed on the pixel electrode PXE. The pixel defining layer PDL is disposed on the pixel electrode PXE and may include an opening to expose the pixel electrode PXE. In an embodiment, the pixel defining layer PDL may include an organic insulating material selected from the group consisting of acrylic resin, epoxy resin, phenolic resin, polyamide resin, polyimide resin, unsaturated polyester resin, polyphenylene resin, polyphenylenesulfide resin, and benzocyclobutene (BCB).

The light emitting layer EML may be disposed on the pixel electrode PXE exposed by the pixel defining layer PDL. The light emitting layer EML may include an organic material layer. The organic material layer of the light emitting layer EML may include an organic light emitting layer, and may further include a hole injecting/transporting layer and/or an electron injecting/transporting layer. In an embodiment, the light emitting layer EML may have a tandem structure in which a plurality of organic light emitting layers are superposed in the thickness direction and a charge generation layer is disposed between the organic light emitting layers. The respective organic light emitting layers superposed may emit light of a same wavelength, or may emit light of different wavelengths. At least some of the layers may be separate from the same layer of neighboring pixels.

The common electrode CME may be disposed on the light emitting layer EML. The common electrode CME may be a second electrode (e.g., a cathode electrode) of the light emitting element EMD. The common electrode CME may be formed commonly to the pixels. In an embodiment, in the top emission type structure, the common electrode CME may be formed of a transparent conductive material (TCO), such as ITO or IZO, capable of transmitting light or a semi-transmissive conductive material, such as magnesium (Mg), silver (Ag), or an alloy of magnesium (Mg) and silver (Ag). When the common electrode CME is formed of a semi-transmissive conductive material, the light emission efficiency can be increased due to a micro-cavity effect.

In the bottom emission type structure, the common electrode CME may be formed of a single layer of aluminum (Al), molybdenum (Mo), titanium (Ti), copper (Cu), or silver (Ag), or may be formed of a metal material having high reflectivity to have a stacked structure (Ti/Al/Ti) of aluminum and titanium, a stacked structure (ITO/Ag/ITO) of silver and ITO, an APC alloy, or a stacked structure (ITO/APC/ITO) of an APC alloy and ITO.

While some example embodiments of the present invention have been described herein, those skilled in the art will appreciate that many variations and modifications may be made to the described embodiments without substantially departing from the principles of the present invention. Therefore, the disclosed example embodiments of the invention are used in a generic and descriptive sense and not for purposes of limitation.

What is claimed is:

1. A mask assembly comprising:
   a mask frame comprising a first mask opening and a second mask opening which are located side by side in a second direction and defined by a support bar extending in a first direction, the second direction intersecting the first direction;
   a first split mask overlapping the first mask opening; and
   a second split mask overlapping the second mask opening,
   wherein the first split mask comprises a first half-etched portion at an end of first and second ends of the first split mask, the first half-etched portion comprising a groove at a lower side of the first split mask that is above and directly facing the support bar and extending from an edge of the first split mask toward a center thereof, and the second split mask comprises a second half-etched portion at an end of first and second ends of the second split mask, the second half-etched portion comprising a groove at a lower side of the first split mask that is above and directly facing the support bar and extending from an edge of the second split mask toward a center thereof, and wherein the first half-etched portion and the second half-etched portion are located side by side in the second direction.

2. The mask assembly of claim 1, wherein the mask frame comprises a first side extending in the first direction, a second side in parallel with the first side and spaced apart from the first side,
   wherein the support bar is between the first side and the second side,
   wherein the first end of the first split mask overlaps the first side and the second end of the first split mask overlaps the support bar, and
   wherein the first end of the second split mask overlaps the support bar and the second end of the second split mask overlaps the second side.

3. The mask assembly of claim 2, wherein the first split mask comprises first fixing portions overlapping the first side and the support bar, respectively, the second split mask comprises second fixing portions overlapping the second side and the support bar, respectively,
   wherein the first split mask comprises a first welding portion on the first fixing portion overlapping the first side, and a second welding portion on the first fixing portion overlapping the support bar, and
   wherein the second split mask comprises a third welding portion on the second fixing portion overlapping the support bar, and a fourth welding portion on the second fixing portion overlapping the second side.

4. The mask assembly of claim 3, wherein the first half-etched portion of the first split mask overlaps the support bar and the first fixing portion overlapping the support bar, and
   wherein the second half-etched portion of the second split mask overlaps the support bar and the second fixing portion overlapping the support bar.

5. The mask assembly of claim 4, wherein the first half-etched portion of the first split mask overlaps the second welding portion, and the second half-etched portion of the second split mask overlaps the third welding portion.

6. The mask assembly of claim 3, wherein another first half-etched portion of the first split mask overlaps the first side and the first fixing portion overlapping the first side, and another second half-etched portion of the second split mask overlaps the second side and the second fixing portion overlapping the second side.

7. The mask assembly of claim 6, wherein the first half-etched portion of the first split mask overlaps the first welding portion, and the second half-etched portion of the second split mask overlaps the fourth welding portion.

8. The mask assembly of claim 1, wherein a thickness of the first half-etched portion is 30% to 70% of a thickness of the first split mask, and a thickness of the second half-etched portion is 30% to 70% of a thickness of the second split mask.

9. The mask assembly of claim 1, wherein the first half-etched portion is continuous or spaced apart from a side of the first split mask facing the second split mask, and the second half-etched portion is continuous or spaced apart from a side of the second split mask facing the first split mask.

10. A method of manufacturing the mask assembly of claim 1, the method comprising:
    preparing the mask frame comprising the first mask opening and the second mask opening which are located side by side in the second direction and defined by the support bar;
    aligning a split mask so as to overlap the first mask opening and the second mask opening and coupling the split mask to the mask frame; and
    cutting a region of the split mask corresponding to the support bar to divide the split mask into the first split mask and the second split mask.

11. The method of claim 10, wherein the mask frame comprises:
    a first side extending in the first direction; and
    a second side in parallel with the first side and spaced apart from the first side,
    wherein the support bar is between the first side and the second side.

12. The method of claim 11, wherein the coupling the split mask to the mask frame comprises:
    performing first welding on a first end of the split mask overlapping the first side;
    performing second welding on a first region of the split mask overlapping the support bar;

performing third welding on a second region of the split mask overlapping the support bar; and performing fourth welding on a second end of the split mask overlapping the second side.

13. The method of claim 12, wherein the dividing the split mask into the first split mask and the second split mask comprises:

cutting between a second welding portion formed by the second welding and a third welding portion formed by the third welding in the split mask.

14. A method of manufacturing the mask assembly of claim 1, the method comprising:

preparing the mask frame comprising the first mask opening and the second mask opening which are located side by side in the second direction and defined by the support bar;

aligning the first split mask so as to overlap the first mask opening and the second mask opening and coupling two regions of the first split mask adjacent to the first mask opening to the mask frame;

cutting a region of the first split mask corresponding to the support bar;

aligning the second split mask so as to overlap the first split mask and the second mask opening, and coupling two regions of the second split mask adjacent to the second mask opening to the mask frame; and cutting a region of the second split mask corresponding to the support bar.

15. The method of claim 14, wherein the mask frame comprises:

a first side extending in the first direction; and a second side in parallel with the first side and spaced apart from the first side, wherein the support bar is between the first side and the second side.

16. The method of claim 15, wherein the coupling the first split mask to the mask frame comprises:

performing first welding on an end of the first split mask overlapping the first side; and performing second welding on a region of the first split mask overlapping the support bar.

17. The method of claim 16, wherein the cutting the first split mask comprises cutting between the second mask opening and a second welding portion of the first split mask formed by the second welding.

18. The method of claim 17, wherein the coupling the second split mask to the mask frame comprises:

performing third welding on a region of the second split mask overlapping the support bar; and performing fourth welding on an end of the second split mask overlapping the second side.

19. The method of claim 18, wherein the cutting the second split mask comprises cutting between the first mask opening and a third welding portion of the second split mask formed by the third welding.

\* \* \* \* \*